United States Patent
Hisamoto et al.

(10) Patent No.: US 8,319,274 B2
(45) Date of Patent: Nov. 27, 2012

(54) SEMICONDUCTOR DEVICE

(75) Inventors: Digh Hisamoto, Kokubunji (JP); Itaru Yanagi, Kunitachi (JP); Yasuhiro Shimamoto, Tokorozawa (JP); Toshiyuki Mine, Fussa (JP); Yutaka Okuyama, Kodaira (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 586 days.

(21) Appl. No.: 11/829,248

(22) Filed: Jul. 27, 2007

(65) Prior Publication Data
US 2008/0073705 A1 Mar. 27, 2008

(30) Foreign Application Priority Data
Sep. 21, 2006 (JP) ................. 2006-255884

(51) Int. Cl.
*H01L 29/792* (2006.01)
(52) U.S. Cl. ............... 257/324; 257/314; 257/E29.309
(58) Field of Classification Search .......... 257/314–326, 257/E29.309
See application file for complete search history.

(56) References Cited

U.S. PATENT DOCUMENTS

| | | | |
|---|---|---|---|
| 4,868,632 A * | 9/1989 | Hayashi et al. | ............... 257/411 |
| 5,969,383 A | 10/1999 | Chang et al. | |
| 6,040,995 A * | 3/2000 | Reisinger et al. | ........ 365/185.18 |
| 6,215,148 B1 | 4/2001 | Eitan | |
| 6,477,084 B1 | 11/2002 | Eitan | |
| 6,858,906 B2 | 2/2005 | Lee et al. | |
| 7,132,718 B2 | 11/2006 | Hisamoto et al. | |
| 7,400,009 B2 | 7/2008 | Lee et al. | |
| 7,576,386 B2 * | 8/2009 | Lue et al. | ...................... 257/324 |
| 2003/0032242 A1 * | 2/2003 | Lee et al. | ...................... 438/257 |
| 2004/0188753 A1 | 9/2004 | Kawashima et al. | |
| 2005/0006698 A1 | 1/2005 | Matsuzaki et al. | |
| 2006/0113586 A1 * | 6/2006 | Wang | ............................ 257/324 |
| 2006/0258090 A1 * | 11/2006 | Bhattacharyya et al. | ...... 438/257 |
| 2007/0290273 A1 * | 12/2007 | Lue et al. | ...................... 257/385 |

FOREIGN PATENT DOCUMENTS
JP 2002-289708 A 10/2002
(Continued)

OTHER PUBLICATIONS

"Physics of Semiconductor Devices, $2^{nd}$ Edition", Wiley-Interscience Pub. by S. Sze, pp. 496 to 506.
(Continued)

*Primary Examiner* — Tucker Wright
(74) *Attorney, Agent, or Firm* — Miles & Stockbridge P.C.

(57) ABSTRACT

A gate dielectric functioning as a charge-trapping layer of a non-volatile memory cell with a structure of an insulator gate field effect transistor is formed by laminating a first insulator formed of a silicon oxide film, a second insulator formed of a silicon nitride film, a third insulator formed of a silicon nitride film containing oxygen, and a fourth insulator formed of a silicon oxide film in this order on a main surface of a semiconductor substrate. Holes are injected into the charge-trapping layer from a gate electrode side. Accordingly, since the operations can be achieved without the penetration of the holes through the interface in contact to the channel and the first insulator, the deterioration in rewriting endurance and the charge-trapping characteristics due to the deterioration of the first insulator does not occur, and highly efficient rewriting (writing and erasing) characteristics and stable charge-trapping characteristics can be achieved.

15 Claims, 19 Drawing Sheets

FOREIGN PATENT DOCUMENTS

| | | |
|---|---|---|
| JP | 2003-68897 A | 3/2003 |
| JP | 2004-303918 A | 10/2004 |
| JP | 2005-11490 A | 1/2005 |
| JP | 2005-228763 A | 8/2005 |
| JP | 2005-347328 A | 12/2005 |
| JP | 2007-281137 A | 10/2007 |

OTHER PUBLICATIONS

Yatsuda et al., "Hi-MNOS II Technology for a 64-kbit Byte-Erasable 5-V-Only EEPROM", IEEE Transaction on Electron Devices, vol. ED-32, No. 2, pp. 224 to 231, 1985.

Chen et al., "A Novel Flash Memory Device with S Plit Gate Source Side Injection and ONO Charge Storage Stack (SPIN)", 1997 Symposium on VLSI Technology Digest of Technical Papers, pp. 63 to 64.

Wu et al., "A Novel High-Speed, 5-Volt Programming EPROM Structure With Source-Side Injection", 1986 IEEE International Electron Device Meeting, Technical Digest, pp. 584 to 587.

Chan et al., "The Impact of Gate-Induced Drain Leakage Current on MOSFET Scaling", 1987 IEEE International Electron Device Meeting, Technical Digest, pp. 718 to 721.

Tsai et al. "Data Retention Behavior of a SONOS Type Two-Bit Storage Flash Memory Cell", 2001 IEEE International Electron Device Meeting, Technical Digest, pp. 719 to 722.

Lue et al., "BE-SONOS: A Bandgap Engineered SONOS with Excellent Performance and Reliability", 2005 IEEE International Electron Device Meeting, Technical Digest, pp. 555 to 558.

Lusky et al., "Retention Loss Characteristics of Localized Charge-Trapping Devices", 2004 International Reliability Physics Symposium Proc., pp. 527 to 530.

Zaima et al., Japanese Journal of Applied Physics, vol. 70, No. 9, 2001, pp. 1050-1060.

Notification of Reasons for Refusal issued Dec. 20, 2011 in counterpart Japanese Application JP 2006-255884.

Notification of Reasons for Refusal issued Dec. 20, 2011 in counterpart Japanese Application JP 2007-234829.

* cited by examiner

Prior Art

FIG. 13A
FIG. 13B
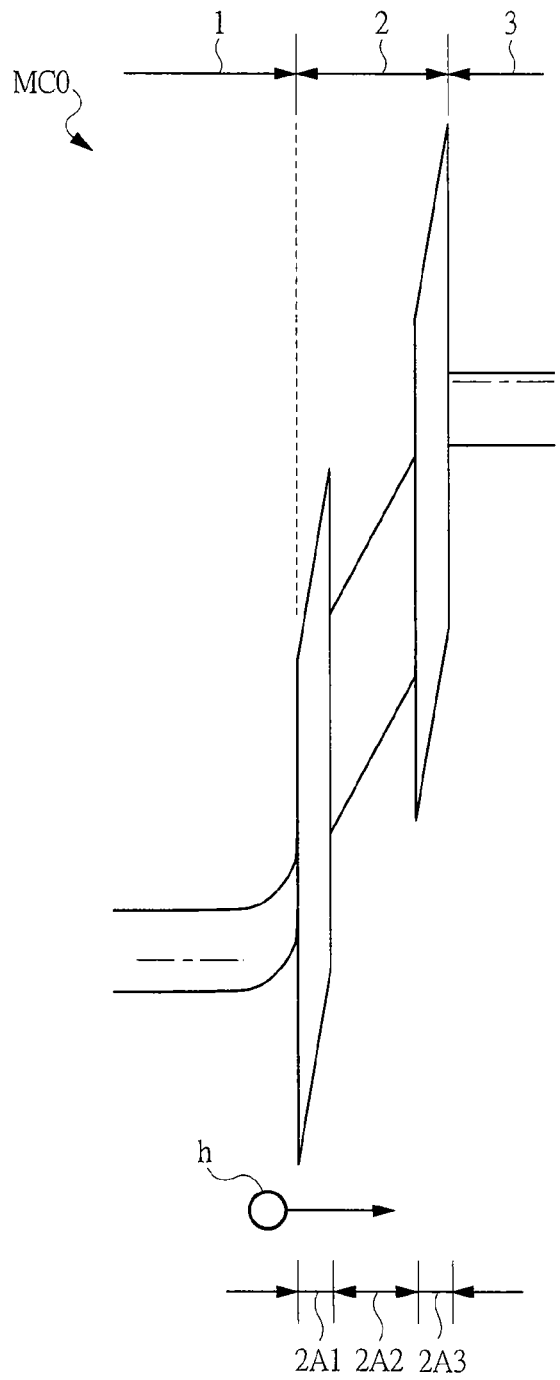
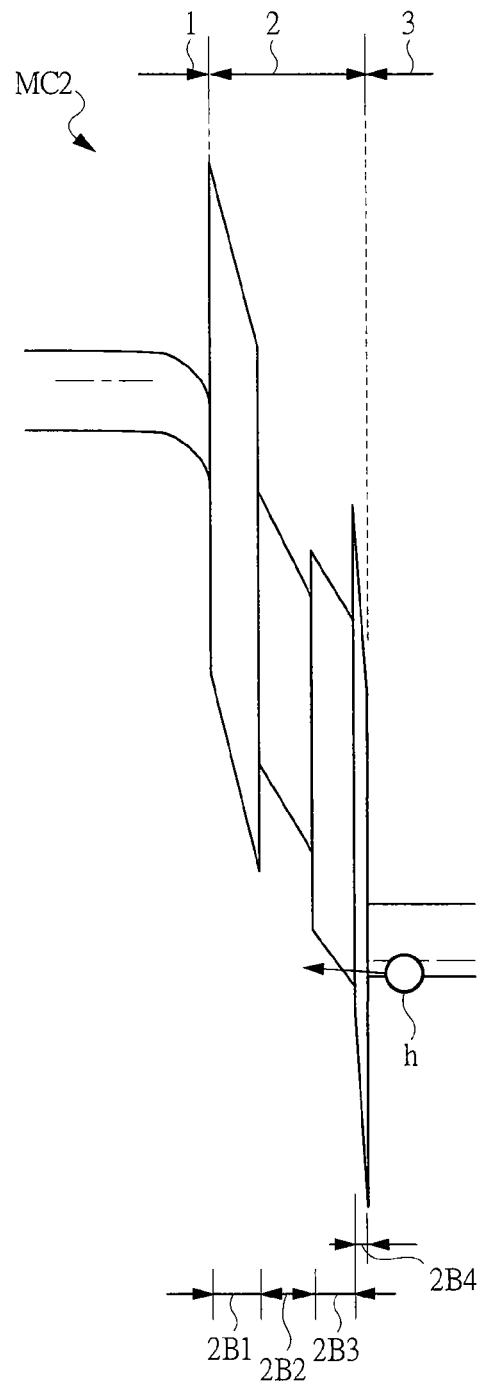

SEMICONDUCTOR DEVICE

CROSS-REFERENCE TO RELATED APPLICATION

The present application claims priority from Japanese Patent Application No. JP 2006-255884 filed on Sep. 21, 2006, the content of which is hereby incorporated by reference into this application.

TECHNICAL FIELD OF THE INVENTION

The present invention relates to a technology for a semiconductor device. More particularly, it relates to a method for effectively operating a device having a non-volatile memory structure.

BACKGROUND OF THE INVENTION

At present, an LSI (Large Scale Integration) in which semiconductor elements are integrated has been used for various system controls and has become a basic infrastructure for society. Since the recent LSI is operated on the basis of the arithmetic processing in accordance with programs, the condition that program can be stored is indispensable in many cases, and a non-volatile memory which is one type of integrated semiconductor memories incorporated in an LSI has become extremely important as an element for satisfying the condition. Since it is required that the LSI is used for various applications by modifying the programs, the non-volatile memory which is rewritable and in which stored data are not lost even when the power of LSI is shut off is indispensable.

With regard to the non-volatile memory of a semiconductor element, for example, "Physics of Semiconductor Devices, 2nd edition", Wiley-Interscience Pub. by S. Sze, pp. 496 to 506 (Non-Patent Document 1) describes a so-called floating gate memory and a memory using an insulator (insulator-type memory). As described herein, a memory in which insulators are laminated and charges are accumulated in the traps of the interface thereof and the insulators does not have to form a new conductive layer in comparison with the floating gate memory, and such a memory has a good matching with the CMOS (Complementary Metal Oxide Semiconductor) LSI process.

As an insulator for accumulating charges, a laminated layer of a nitride film and an oxide film has been widely used because it can achieve both the charge-trapping characteristics and the rewriting characteristics. For example, as a pioneer development example, a report by Yatsuda et al. "IEEE Transaction on Electron Devices" Vol. ED-32, No. 2, pp. 224 to 231, 1985 (Non-Patent Document 2) is known. In this report, a two-transistor cell in which a memory transistor and a select transistor are arranged in series is used. In the memory transistor, by applying bias between the channel and gate, the injection and emission of the charges into and from the whole surface of the channel are performed using F-N (Fowler-Nordheim) tunnel current and direct tunnel current.

SUMMARY OF THE INVENTION

However, the pursuit of the sufficient charge-trapping characteristics while performing the charge injection and emission basically causes some problems. For example, in an actual use, when the thickness of the laminated film is increased in order to have sufficient charge-trapping characteristics, the writing and erasing become difficult, and the time required for the writing and erasing exceeds the range acceptable for the practical use.

For its prevention, a method in which charges of different polarity are injected using hot carriers instead of emitting the charges, thereby rewriting the stored data has been proposed. In this method, since the hot carrier injection is used, the charge injection can be efficiently performed even when a thick insulator is formed.

This method is described in, for example, U.S. Pat. No. 6,215,148 (Patent Document 1). According to this method, since electrons and holes can be alternately injected locally, different charge injection states are formed at the end portions of a planar-type MOSFET in a channel direction, that is, at the end portions of the source and drain diffusion layers and are read out as charge data. This memory cell basically has the device structure of MOSFET, but in the structure of the memory cell, a gate dielectric is replaced from a usual silicon oxide film to a three-layered laminated structure of a silicon oxide film, a silicon nitride film, and a silicon oxide film. However, as a method for configuring a memory array, the source and drain diffusion layers are formed below a thick device isolation oxide film, and a diffusion layer formed in a linear shape extending in the same direction as that of a gate electrode is used as a wiring layer. In any of the arrays, when focusing on one cell, the basic memory cell operation is identical in many cases, which will be described below. Further, the laminated structure of the gate dielectric is referred to as MONOS (Metal-Oxide-Nitride-Oxide-Semiconductor (Silicon)), and it is used also herein.

The planar arrangement of a typical non-volatile memory cell is shown in FIG. 1A, and the cross-sectional structure thereof taken along the line X1-X1 in FIG. 1A is shown in FIG. 1B. A semiconductor substrate (hereinafter, simply referred to as substrate) 1 is made of, for example, p type single crystal silicon (Si), and a gate electrode 3 is formed on a main surface of the substrate 1 via a gate dielectric 2. The gate dielectric 2 has a function as a charge-trapping layer which traps the charges related to the data storage in a non-volatile memory cell MC0, and it is formed by laminating three insulators 2A1, 2A2, and 2A3 in this order on the main surface of the substrate 1. The insulators 2A1 and 2A3 are formed of, for example, silicon oxide films, and the insulator 2A2 therebetween is formed of, for example, a silicon nitride film. On both sides of the gate electrode 3 in a width direction (short-side direction) on the main surface of the substrate 1, diffusion layers 4a and 4b for source and drain are formed.

The writing operation, erasing operation, and reading operation of the non-volatile memory cell MC0 are shown in FIG. 2A to FIG. 2D.

In the writing operation, 15V, 0V, and 5V are applied to the gate electrode 3 (word line WL), the diffusion layer 4a (bit line BL1), and the diffusion layer 4b (bit line BL2), respectively. The electrons accelerated by the field of the channel are brought into a hot-carrier state and are injected into a charge-accumulating portion at the end of the diffusion layer 4b (BL2) (FIG. 2A). It is known that the avalanche phenomenon and the substrate bias acceleration are used as the method for generating the hot carriers.

In the erasing operation, −6V, 0V, and 6V are applied to the gate electrode 3 (WL), the diffusion layer 4a (BL1), and the diffusion layer (BL2), respectively, as shown in FIG. 2B. Holes are generated by the interband tunneling at the end portion of the diffusion layer 4b (BL2) and are accelerated by applying bias between the diffusion layer 4b (BL2) and the substrate 1. By this means, the holes are injected into the charge-trapping layer (insulator 2A2 of gate dielectric 2).

In the reading operation, 3V, 1V, and 0V are applied to the gate electrode 3 (WL), the diffusion layer 4a (BL1), and the diffusion layer 4b (BL2), respectively. By doing so, channel current flows in an arrow direction in FIG. 2C, and the amount of channel current is read as the trapped-charge data. More specifically, when electrons are injected into the end of the diffusion layer 4b (BL2), the threshold value is high and the channel current does not flow. Also, in the state where the holes are injected, the threshold value is low and the large amount of channel current is observed.

In the non-volatile memory cell MC0 described above, the threshold value is significantly affected by the charges injected into the end portion of the diffusion layer to be a source in the reading, and it does not much depend on the charge state of the end portion of the diffusion layer to be a drain. Therefore, by exchanging the diffusion layer 4a (BL1) and the diffusion layer 4b (BL2) in use, it becomes possible to use one cell as two bits. FIG. 2D shows the case where the diffusion layer 4a (BL1) side is read by injecting electrons into the diffusion layer 4a (BL1) side and holes into the diffusion layer 4b (BL2) side. In this case, holes are accumulated (trapped) in the diffusion layer 4a (BL1) side and electrons are accumulated (trapped) in the diffusion layer 4b (BL2) side.

Further, as another memory cell different from the above-described method by Yatsuda et al., a memory cell operated as a memory by combining two transistors instead of one memory transistor is also proposed. The operation thereof is described in, for example, "1997 Symposium on VLSI Technology" pp. 63 to 64 (Non-Patent Document 3). In this structure, the polycrystalline silicon gate for the memory operation and the gate to select the memory cell are separately formed. Further, the similar description is found in U.S. Pat. No. 5,969,383 (Patent Document 2) and U.S. Pat. No. 6,477,084 (Patent Document 3), and such a structure is called a "split gate" structure in some cases.

In the non-volatile memory cell structure, basically, two transistors based on an n channel MOSFET are provided. More specifically, a select transistor and its adjacent memory transistor are coupled in a so-called "vertical mounting" arrangement. FIG. 3A is an equivalent circuit diagram thereof. Further, FIG. 3B is a plan view showing an example of the memory cell corresponding to the circuit shown in FIG. 3A, and FIG. 3C is a cross-sectional view taken along the line X2-X2 in FIG. 3B.

The non-volatile memory cell MC1 has a select transistor Qs and a memory transistor Qm. The select transistor Qs and the memory transistor Qm are electrically connected in series.

A gate electrode 5 of the select transistor Qs is made of, for example, low-resistance polycrystalline silicon, and it is formed on the main surface of the substrate 1 via a gate dielectric 6. The gate dielectric 6 is formed of, for example, a silicon oxide film. On the other hand, a gate electrode 7 of the memory transistor Qm is made of, for example, low-resistance polycrystalline silicon, and it is formed on the main surface of the substrate 1 and a side surface of the gate electrode 5 of the select transistor Qs via a gate dielectric 2. As shown in FIG. 3C, it is effective to use the process called spacer for the gate electrode 7 of the memory transistor Qm. However, the forming method and the like will be described in detail in the embodiments of the present invention. The gate dielectric 2 of the memory transistor Qm is a charge-trapping layer and has a so-called MONOS structure formed by sandwiching a silicon nitride film between silicon oxide films.

Further, in the main surface of the substrate 1, a diffusion layer 9D for drain is formed on one side of the gate electrode 5, and a diffusion layer 9S for source is formed on one side of the gate electrode 7. Each of the diffusion layers 9D and 9S includes a low impurity concentration diffusion layer 9a and a high impurity concentration diffusion layer 9b. The diffusion layer 9a is formed on the channel side, and the diffusion layer 9b is formed at a position apart from the channel by the length of the diffusion layer 9a in a state of being electrically connected to the diffusion layer 9a. The diffusion layers 9D and 9S are formed with using the gate electrodes 5 and 7 as masks, respectively.

An example of the arrangement of the memory cell array configured by using the non-volatile memory cells MC1 is shown in FIG. 4. The gate electrodes (select gate and memory gate) 5 and 7 of the select transistor Qs and the memory transistor Qm form the word lines denoted by SGL and MGL, respectively. Also, the diffusion layer 9D of the select transistor Qs functions as the bit line BL, and the diffusion layer 9S of the memory transistor Qm functions as the source line SL.

FIG. 5 and FIG. 6 show the typical writing operation and erasing operation of the non-volatile memory cell MC1. As the basic operations of the memory cell, four states such as (1) writing, (2) erasing, (3) holding, and (4) reading are considered. However, the names for these four states are used as representative ones, and writing and erasing may be called in an opposite way. Further, the operations will be described based on representative examples, but various different operations can be considered. Although a non-volatile memory cell formed of an n channel MOSFET will be described here as an example, the memory cell can be formed of a p channel MOSFET in the same manner in principle.

(1) FIG. 5 schematically shows the writing operation. Positive potential is applied to the diffusion layer 9S on the gate electrode 7 side of the memory transistor Qm, and ground potential equal to that of the substrate 1 is applied to the diffusion layer 9D on the gate electrode 5 side of the select transistor Qs. By applying the gate overdrive voltage which is high relative to the substrate 1 to the gate electrode 7 of the memory transistor Qm, the channel below the gate electrode 7 of the memory transistor Qm is put into an ON state. Then, the potential of the gate electrode 5 of the select transistor Qs is set to the value higher than the threshold value by 0.1 to 0.2V, thereby putting it into an ON state. At this time, since the strongest field occurs in the vicinity of the boundary of the two gate electrodes 5 and 7, many hot electrons are generated and injected into the gate electrode 7 side of the memory transistor Qm. The generation of carriers by the impact ionization is denoted by El. Electrons are illustrated by white circles and holes are illustrated by hatched circles. This phenomenon is known as the source side injection (SSI), and it is described by A. T. Wu et al. in "1986 IEEE International Electron Device Meeting, Technical Digest" pp. 584 to 587 (Non-Patent Document 4). Although the floating gate memory cell is used in this description, the injection mechanism is identical even in the insulator-type memory cell. The hot electron injection by this method is characterized in that, since the field is concentrated around the boundary between the gate electrode of the select transistor and the gate electrode of the memory transistor, in the gate electrode of the memory transistor, the injection is concentrated on the end portion on the side of the gate electrode of the select transistor. Further, the charge-trapping layer is formed of an electrode in the floating gate memory cell, but the charges are accumulated in an insulator in the insulator-type memory cell. Therefore, the electrons are trapped in an extremely narrow region.

(2) FIG. 6 schematically shows the erasing operation. Negative potential is applied to the gate electrode 7 of the memory transistor Qm, and positive potential is applied to the diffusion layer 9S on the gate electrode 7 side, thereby generating the strong inversion in the region where the gate electrode 7 at the end portion of the diffusion layer and the diffusion layer 9S are overlapped. By doing so, the interband tunneling occurs, and the holes are generated. The generation of holes is denoted by E2. The interband tunneling is described by T. Y. Chan et al. in "1987 IEEE International Electron Device Meeting, Technical Digest" pp. 718 to 721 (Non-Patent Document 5). In this non-volatile memory cell MC1, the generated holes are accelerated in the channel direction, drawn by the bias of the gate electrode 7 of the memory transistor Qm, and injected into the MONOS film. In this manner, the erasing operation is carried out. Further, the state where the generated holes form secondary electron-hole pairs is denoted by E3. These carriers are also injected into the MONOS film. More specifically, the threshold value of the gate electrode 7 of the memory transistor Qm which is increased by the charges of the electrons can be reduced by the charges of the injected holes.

(3) In the holding, charges are trapped as the charges of carriers injected into the MONOS insulator. Since the movement of the carriers in the insulator is extremely limited and slow, it is possible to appropriately trap the charges even if no voltage is applied to the electrode.

(4) In the reading operation, positive potential is applied to the diffusion layer 9D on the gate electrode 5 side of the select transistor Qs, and positive potential is applied to the gate electrode 5 of the select transistor Qs. By doing so, the channel below the gate electrode 5 is put into an ON state. Then, an appropriate gate potential of the memory transistor Qm capable of distinguishing the difference in threshold values of the gate electrode 7 of the memory transistor Qm given by the writing state and the erasing state (that is, the intermediate potential between the threshold value in the writing state and the threshold value in the erasing state) is applied. By this means, the trapped charge data can be read as a current.

As described in the reports mentioned above, the charge injection using hot carriers is characterized by its efficiency. On the other hand, it is known that, since the carrier injection in a high-energy state applies large stress to the film and the charge injection is locally carried out, the rewriting endurance and the charge-trapping characteristics are deteriorated. This deterioration is described by W. J. Tsai et al. in "2001 IEEE International Electron Device Meeting, Technical Digest" pp. 719 to 722 (Non-Patent Document 6). In the Non-Patent Document 6, the deterioration of the charge-trapping characteristics in the non-volatile memory cell structure described with reference to FIG. 1 and FIG. 2 is described. According to the description, by the hole injection of hot carriers, traps are formed in the silicon oxide film on the substrate side of the MONOS, and since the charges are moved via the traps, the deterioration of the charge-trapping characteristics is caused along with the repeated rewriting operation. Further, according to "2004 International Reliability Physics Symposium Proc." pp. 527 to 530 by E. Lusky et al. (Non-Patent Document 7), the deterioration of the charge-trapping characteristics is caused by the mechanism of the expansion due to the horizontal movement of the holes locally injected into a nitride film.

These problems of the film deterioration are caused because the holes are injected using hot carriers, and the deterioration is regarded to be caused due to the local injection at a high-field position. Accordingly, it is necessary to make it possible to perform the non-local hole injection without using hot carriers, even when a thick barrier film having sufficient charge-trapping characteristics is provided.

As a method for solving the above-mentioned problems, "2005 IEEE International Electron Device Meeting, Technical Digest" pp. 555 to 558 by H. Lue et al. (Non-Patent Document 8) describes the hole injection without using hot carriers. In the structure of a laminated insulator using a silicon oxide film as a barrier layer, when injecting holes from the channel, the tunnel injection is impossible because a silicon oxide film formed between the silicon nitride film and the substrate is thick. Therefore, instead of the silicon oxide film, a laminated structure of an extremely thin silicon oxide film, silicon nitride film, and silicon oxide film is formed, thereby creating the state where the holes can be easily tunneled from the substrate side when field is being applied. However, since the substrate side is required to be used as a channel in the reading operation, the thickness of the oxide film has to be increased in order to maintain the channel characteristics and suppress the change in threshold value due to the disturbance. Further, when injecting holes, since the charges are moved through the barrier film, the holes pass through the channel interface. Accordingly, the deterioration of the interface characteristics is still inevitable.

Therefore, an object of the present invention is to provide a technology capable of improving the electric characteristics of a semiconductor device having a non-volatile memory structure.

The above and other objects and novel characteristics of the present invention will be apparent from the description of this specification and the accompanying drawings.

The typical one of the inventions disclosed in this application will be briefly described as follows.

That is, a semiconductor device according to the present invention comprises: a non-volatile memory element in which a gate dielectric formed on a substrate is used as a charge-trapping layer, wherein the gate dielectric has a structure in which a first insulator, a second insulator, a third insulator, and a fourth insulator are laminated in this order from a side of the semiconductor substrate, and the third insulator has a bandgap larger than a bandgap of the second insulator and has an energy barrier to charges.

Also, another typical one of the inventions disclosed in this application will be briefly described as follows.

That is, in the present invention, in a non-volatile memory cell having a charge-trapping layer using a laminated insulator, the injection of holes into the charge-trapping layer is carried out from the side of a gate electrode. Further, the band structure on the gate electrode side of the laminated insulator of the charge-trapping layer is formed by the laminated structure of the bands capable of facilitating the hole injection from the gate electrode.

The effects obtained by typical aspects of the present invention will be briefly described below.

That is, an insulator gate field effect transistor structure in which a field effect is applied to a substrate surface by a gate electrode formed on the substrate via a gate dielectric comprises a non-volatile memory element using the gate dielectric as a charge-trapping layer, in which the gate dielectric has a structure in which a first insulator, a second insulator, a third insulator, and a fourth insulator are laminated in this order from the substrate side, and the third insulator has a bandgap larger than a bandgap of the second insulator and has an energy barrier to the charges. Accordingly, it is possible to improve the electric characteristics of a semiconductor device having the non-volatile memory structure.

BRIEF DESCRIPTIONS OF THE DRAWINGS

FIG. 13A is an explanatory diagram of a band structure in the hole injection of the gate dielectric having a charge-trapping layer of the non-volatile memory cell with the MONOS structure shown in FIG. 1 which has been examined by the inventors of the present invention;

FIG. 13B is an explanatory diagram of a band structure in the hole injection of the gate dielectric having a charge-trapping layer of the non-volatile memory cell in FIG. 10;

DESCRIPTIONS OF THE PREFERRED EMBODIMENTS

In the embodiments of the present invention, a semiconductor device having a non-volatile memory capable solving the above-described problems and achieving both the efficient writing and erasing characteristics and stable charge-trapping characteristics is provided.

In the embodiments described below, the invention will be described in a plurality of sections or embodiments. However, these sections or embodiments are not irrelevant to each other unless otherwise stated. Further, components having the same function are denoted by the same reference symbols throughout the drawings for describing the embodiment, and the repetitive description thereof will be omitted as much as possible. Hereinafter, embodiments of the present invention will be described in detail based on the accompanying drawings.

First Embodiment

The hole injection from the gate electrode side which is the feature of the first embodiment can be understood by the one-dimensional band structure in a direction vertical to the substrate. Therefore, in the first embodiment, the case of using a non-volatile memory cell (hereinafter, simply referred to as memory cell in the embodiments below) having the same device structure as a normal MOSFET (Metal Oxide Field Effect Transistor) whose structure is characteristic will be described as a typical cell structure. Thereafter, the electron injection method will be examined, and the case where it is used for the cell structure suitable for high-speed operation will be described. In these cases, optimal structure can be selected and used in accordance with the use of the memory cell.

Figure 1A:
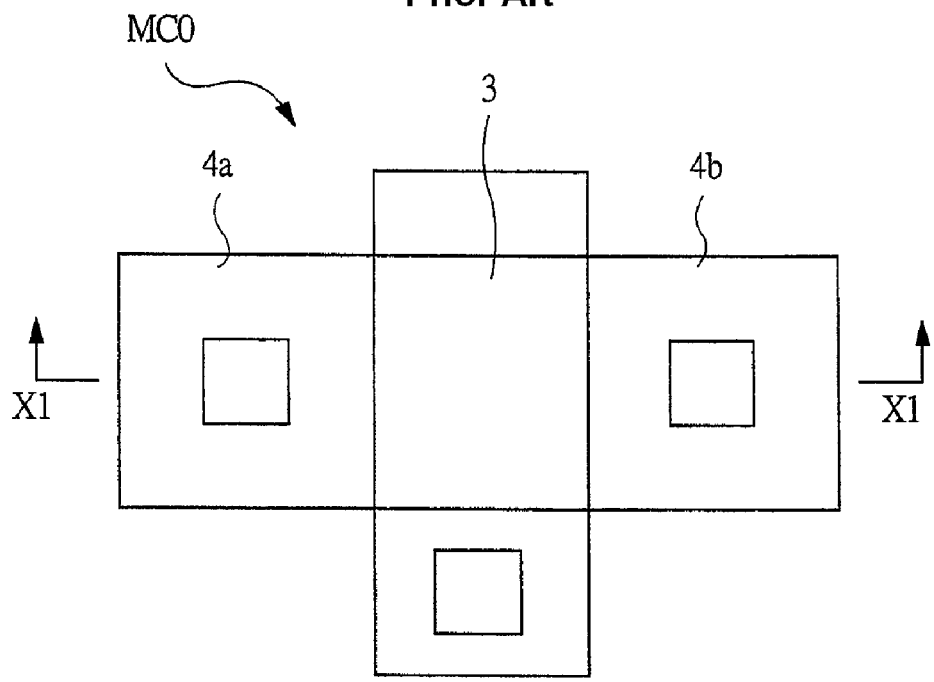
FIG. 1A is a plan view of a typical non-volatile memory cell.

The manufacturing process of a semiconductor device having a non-volatile memory according to the first embodiment will be described below with reference to FIG. 7 to FIG. 10. By this means, the structure thereof will be described. In this case, FIG. 7 to FIG. 10 are cross-sectional views corresponding to the sections taken along the line X1-X1 in FIG. 1A, and the description will be made with using the process technology of so-called 0.13-micron generation as an example.

Figure 7:
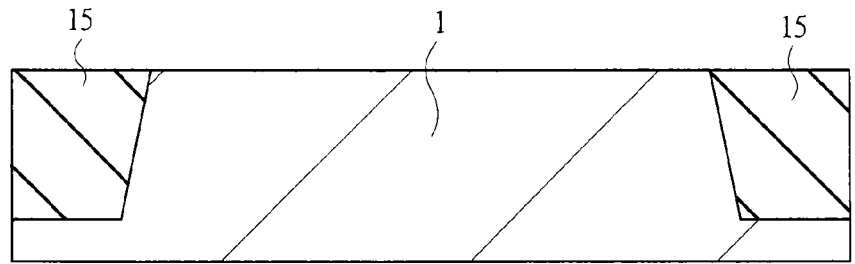
FIG. 7 is a cross-sectional view showing a non-volatile memory cell in the manufacturing process of a semiconductor device according to an embodiment of the present invention.

First, as shown in FIG. 7, a substrate 1 (circular wafer in this case) is prepared. The substrate 1 is made of, for example, p type single crystal silicon (Si) and has a first main surface and a second main surface located on opposite sides in a thickness direction. Element isolation regions 15 and an active region surrounded thereby are formed in the first main surface of the substrate 1 through the well-known shallow trench isolation (STI) process. Further, through the boron ion implantation process and the activation annealing process, well regions with the concentration of $10^{17}$ cm$^{-3}$ can be formed in the substrate surface.

Figure 8:
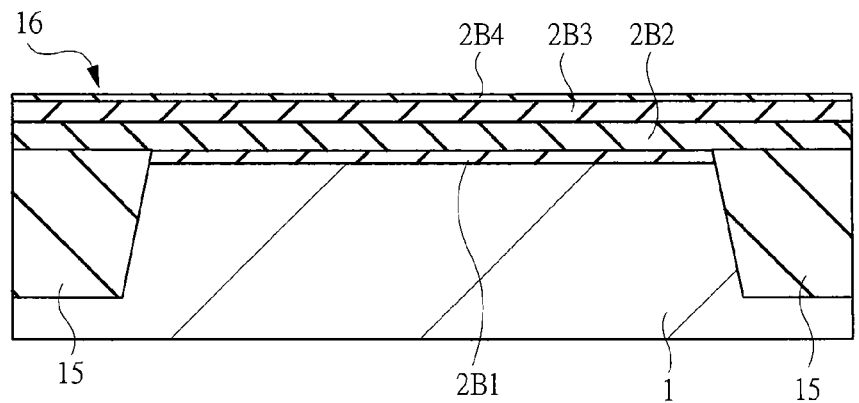
FIG. 8 is a cross-sectional view showing the non-volatile memory cell in the manufacturing process of the semiconductor device continued from FIG. 7.

Subsequently, as shown in FIG. 8, after performing the sacrificial oxidation in the active region of the main surface of the substrate 1 and removing the sacrificial layer, the exposed first main surface of the substrate 1 is oxidized about 4 nm, thereby forming an insulator (first insulator) 2B1 formed of a silicon oxide film. Subsequently, an insulator (second insulator, charge-trapping layer, charge-accumulating layer) 2B2 formed of, for example, a silicon nitride film and having a thickness of about 6 nm is deposited on the main surface of the substrate 1 by CVD (Chemical Vapor Deposition) method. Then, an insulator (third insulator) 2B3 formed of a silicon nitride film containing oxygen and having a thickness of about 5 nm is deposited thereon.

In general, in the CVD of a silicon nitride film, $SiH_2Cl_2$ and $NH_3$ are used as material gas. For example, the silicon nitride film containing a predetermined concentration of oxygen can be formed by adding oxidation material $N_2O$ to the material gas and restricting the $NH_3$ flow rate. The silicon nitride film containing oxygen can increase the bandgap in comparison to a silicon nitride film (see FIG. 11). In this case, the composition ratio between oxygen and nitrogen is controlled to 1:1.

Thereafter, an insulator (fourth insulator) 2B4 formed of, for example, a silicon oxide film is formed to have a thickness of 1 nm on the insulator 2B3. An ISSG (In-Situ Steam Generation) oxidation can be used to form the insulator 2B4. More specifically, the silicon nitride film containing oxygen (insulator 2B3) is subjected to ISSG oxidation, thereby forming the insulator 2B4 having a thickness of 1 nm on the insulator 2B3. In this case, since the silicon nitride film containing oxygen (insulator 2B3) is oxidized when forming the insulator 2B4, the insulator 2B3 is required to be deposited so as to have a thickness enough for the oxidation in advance. In this manner, the gate dielectric 2 having the laminated insulator structure serving as a charge-trapping layer is formed.

Figure 9:
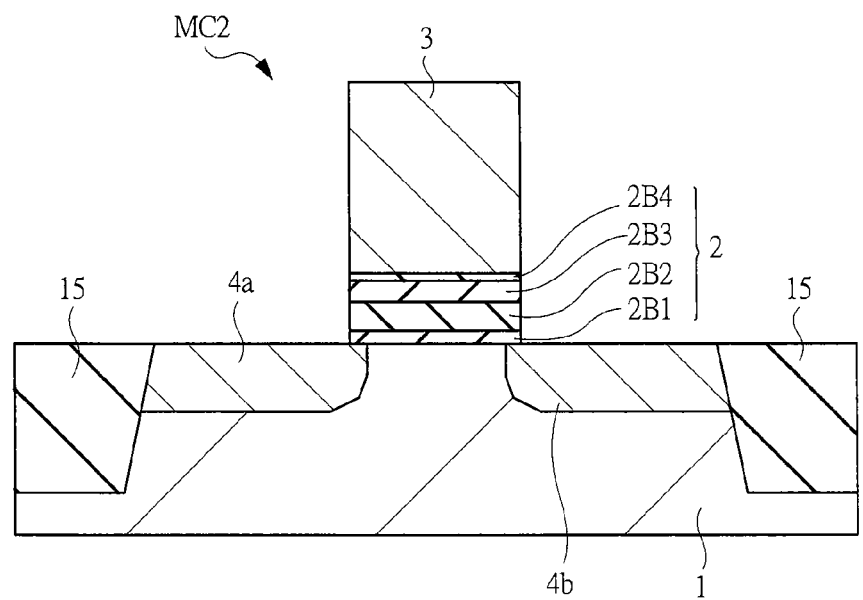
FIG. 9 is a cross-sectional view showing the non-volatile memory cell in the manufacturing process of the semiconductor device continued from FIG. 8.

Next, as shown in FIG. 9, a p type polycrystalline silicon film with a thickness of about 150 nm which is heavily doped with boron (B) is deposited by CVD method or the like, and then, the polycrystalline silicon film is processed using gate patterns by the dry etching method, thereby forming a gate electrode 3. Subsequently, arsenic (As) is implanted by the ion implantation method using the gate electrode 3 as a mask with the energy of 40 keV and the dose amount of $2 \times 10^{15}$ cm$^{-2}$, and is activated by the thermal treatment at 950° C. for 60 seconds. By this means, diffusion layers 4a and 4b for the source and drain are formed in the first main surface of the substrate 1 on both sides of the gate electrode 3.

In this manner, the memory cell MC2 of an insulator gate field effect transistor is formed. In this embodiment, the gate electrode 3 is eventually made of p type polycrystalline silicon. This is because, since holes are injected into the charge-trapping layer from the side of the gate electrode 3 in this embodiment as described below, it is necessary to improve the hole injection efficiency.

Figure 10:
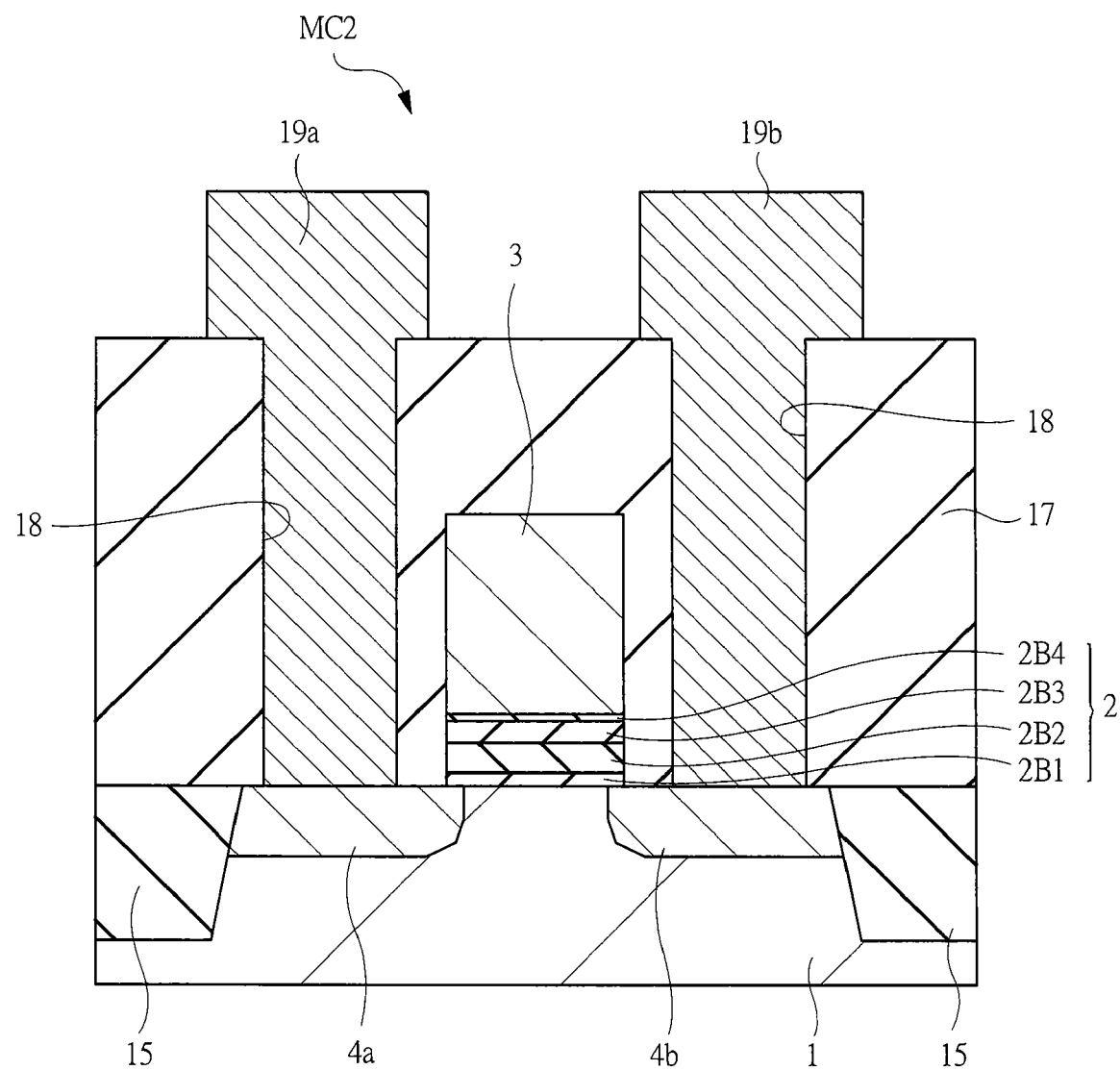
FIG. 10 is a cross-sectional view showing the non-volatile memory cell in the manufacturing process of the semiconductor device continued from FIG. 9.

Thereafter, as shown in FIG. 10, after an insulator 17 is formed on the main surface of the substrate 1, the well-known wiring process is performed. By doing so, contact holes which reach the diffusion layers 4a and 4b and the gate electrode 3 are formed in the insulator 17, and further, diffusion layer electrodes 19a and 19b and the gate electrode wirings are formed on the insulator 17. The plan view at this time is equal to FIG. 1A.

FIG. 10 shows the structure in which diffusion layer electrodes 19a and 19b are electrically connected to the diffusion layers 4a and 4b for the source and drain, respectively. Alternatively, it is also possible to use the diffusion layers 4a and 4b as wirings by forming them in a linear form. Further, in a memory array structure, a diffusion layer of one memory cell can be shared by adjacent memory cells, and a contact with the electrode can be disposed there. Also, though a structure with a single metal layer is shown in FIG. 10, multiple layers of wirings are formed in a semiconductor device. However, since the technology is well-known, the description thereof is omitted here.

Figure 1B:
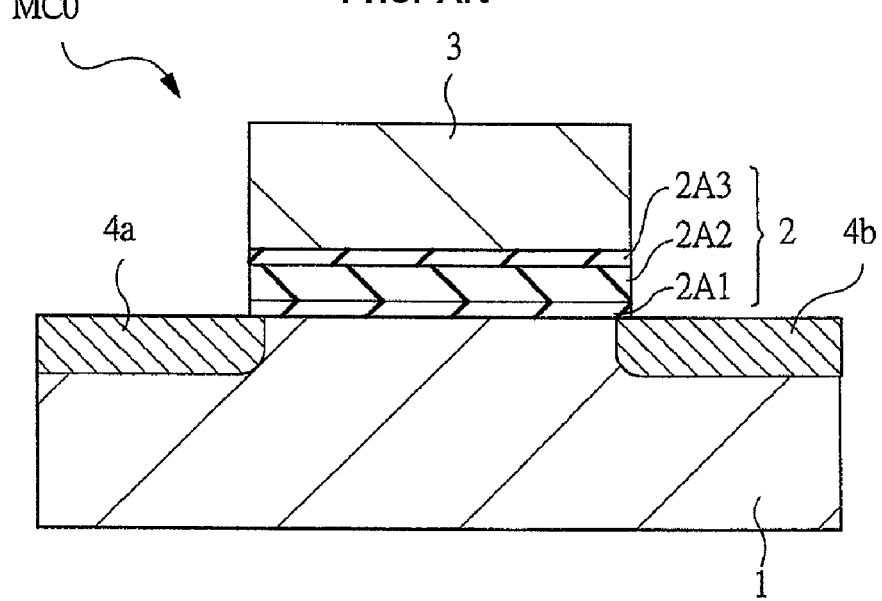
FIG. 1B is a cross-sectional view taken along the line X1-X1 in FIG. 1A.
Figure 2A:
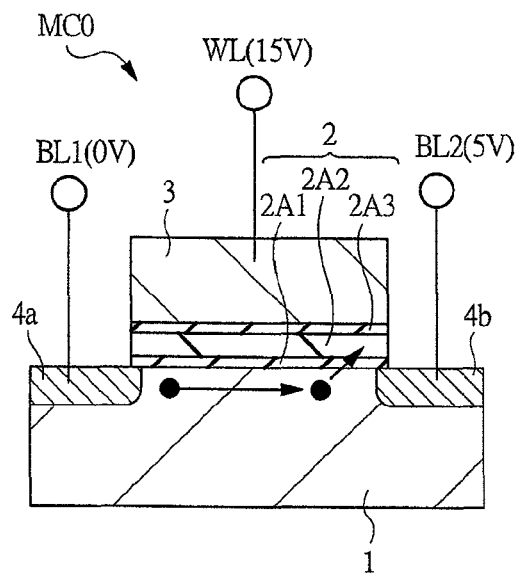
FIG. 2A is an explanatory diagram of the writing operation of a non-volatile memory cell.
Figure 2B:
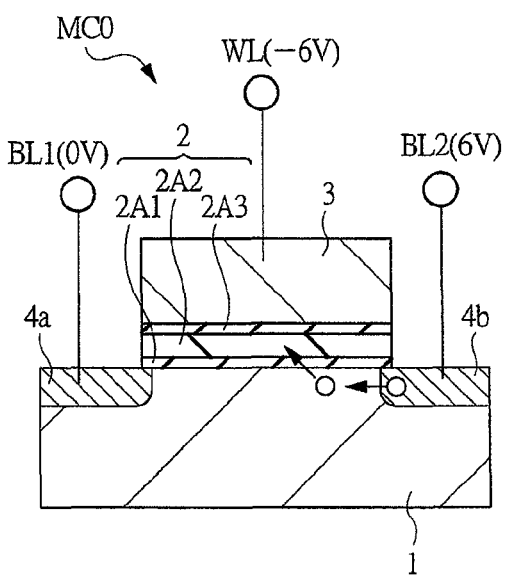
FIG. 2B is an explanatory diagram of the erasing operation of a non-volatile memory cell.
Figure 2C:
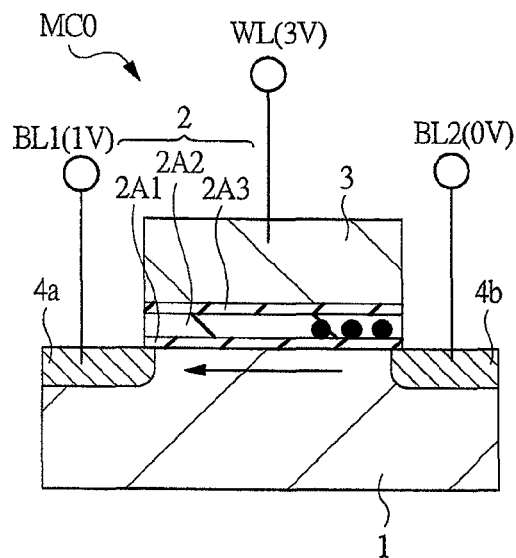
FIG. 2C is an explanatory diagram of the reading operation of a non-volatile memory cell.
Figure 2D:
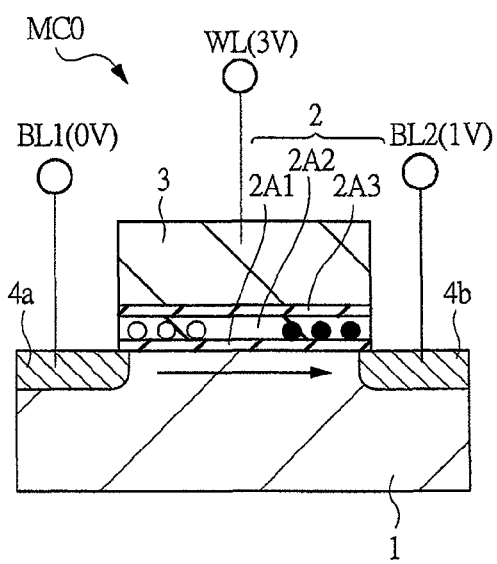
FIG. 2D is an explanatory diagram of the reading operation of a non-volatile memory cell.
Figure 11A:
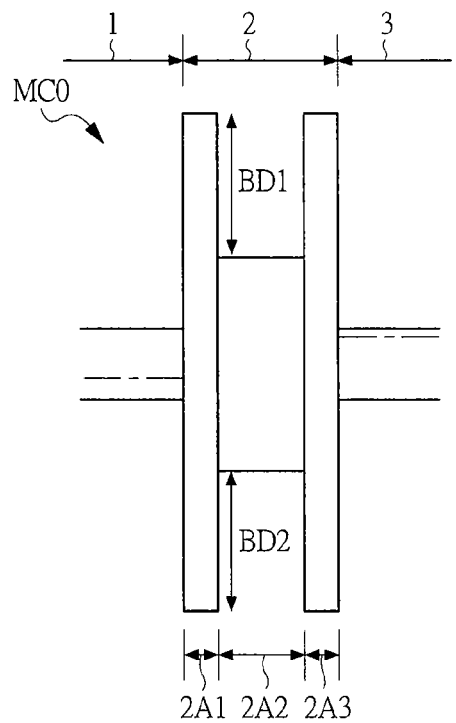
FIG. 11A is an explanatory diagram of a band structure of the gate dielectric having a charge-trapping layer of the non-volatile memory cell with the MONOS structure shown in FIG. 1 which has been examined by the inventors of the present invention.
Figure 11B:
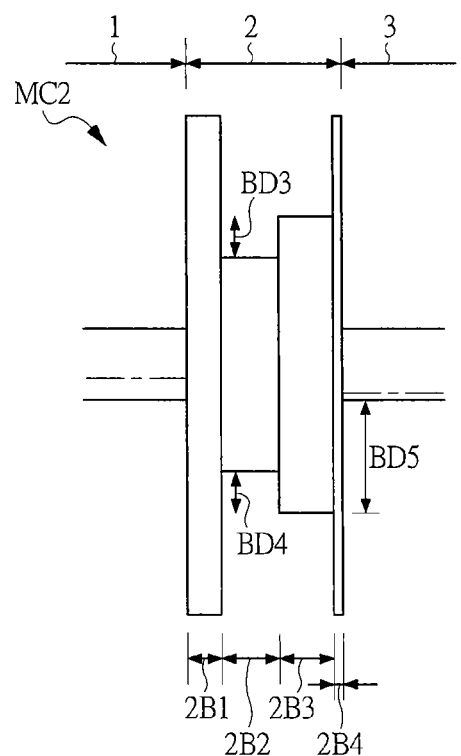
FIG. 11B is an explanatory diagram of a band structure of the gate dielectric having a charge-trapping layer of the non-volatile memory cell shown in FIG. 10.

FIG. 11 shows a comparison between a band structure of the laminated insulator (gate dielectric 2) functioning as a charge-trapping layer of the memory cell MC2 according to the first embodiment formed in the above-described manner (FIG. 11B) and a band structure of the laminated insulator (gate dielectric 2) functioning as a charge-trapping layer of the memory cell MC0 with the MONOS structure shown in FIG. 1 which has been examined by the inventors of the present invention (FIG. 11A).

In both structures, the charge traps of the silicon nitride films (insulators 2A2 and 2B2) are the main charge-trapping layers. In the structure of the memory cell MC0, the band offsets for electrons and holes BD1 and BD2 in the silicon oxide films (insulators 2A1 and 2A3) and the silicon nitride film (insulator 2A2) are 1.1 eV and 2.9 eV, respectively, according to "Applied Physics, Vol. 70, No. 9 (2001)" p. 1050 by Zaima et al. (Non-Patent Document 9).

In the silicon nitride film containing oxygen (insulator 2B3) in the structure of the memory cell MC2 of the semiconductor device according to the first embodiment, electrons and holes have the offset barriers (band offsets BD3 and BD4) of 0.5 eV and 0.8 eV to the charge-trapping layer (insulator 2B2), respectively. Note that the band offset BD5 corresponds to the offset for the hole injection from the gate electrode 3. Also, FIG. 11 shows the flat-band state (state where no bias is applied to the gate dielectric 2 between the gate electrode 3 and the substrate 1, that is, state where electric field of the gate dielectric 2 having no charge is zero or electric field of the channel surface is zero).

Next, writing and erasing operations of the memory cell MC2 according to the first embodiment will be described.

Also in the case of the writing and erasing in the memory cell MC2 according to the first embodiment, similar to those in the memory cell MC0 shown in FIG. 1 and FIG. 2, electrons and holes are injected to change the total amount of charges, thereby storing data. The names for the writing and erasing depend on the method thereof, and do not depend on the basic operation of the memory cell. Therefore, the description will be made based on the injection method of electrons and holes. Also in the first embodiment, the reading operation is the same as that described with reference to FIG. 2C.

Figure 12A:
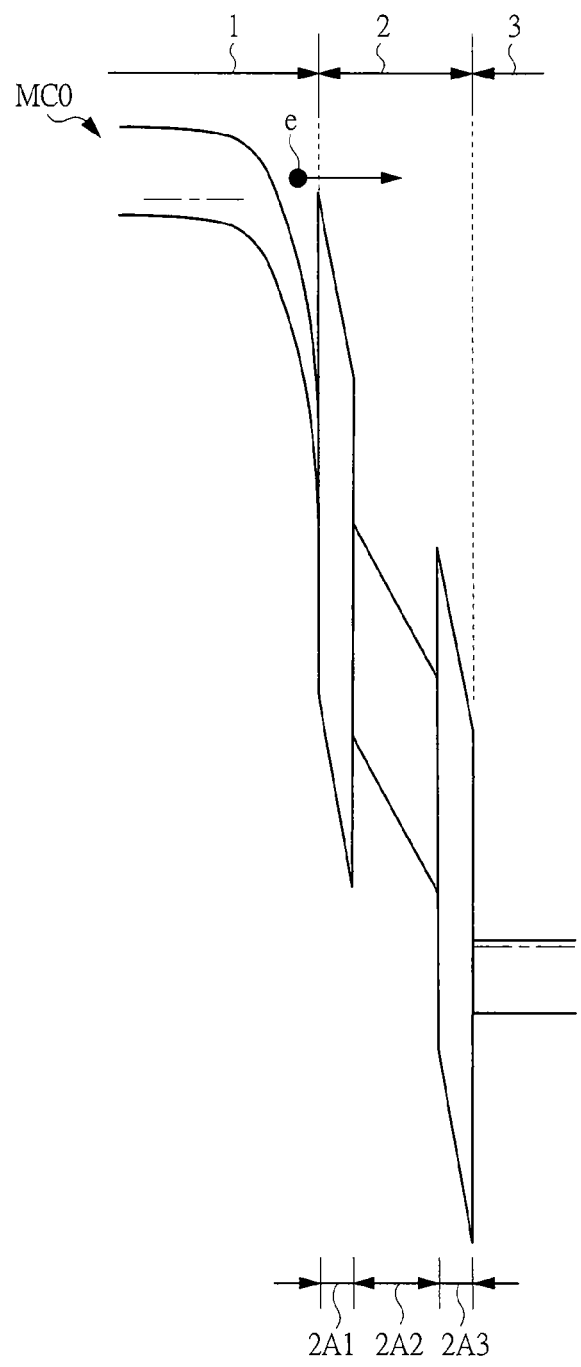
FIG. 12A is an explanatory diagram of a band structure in the electron injection of the gate dielectric having a charge-trapping layer of the non-volatile memory cell with the MONOS structure shown in FIG. 1 which has been examined by the inventors of the present invention.
Figure 12B:
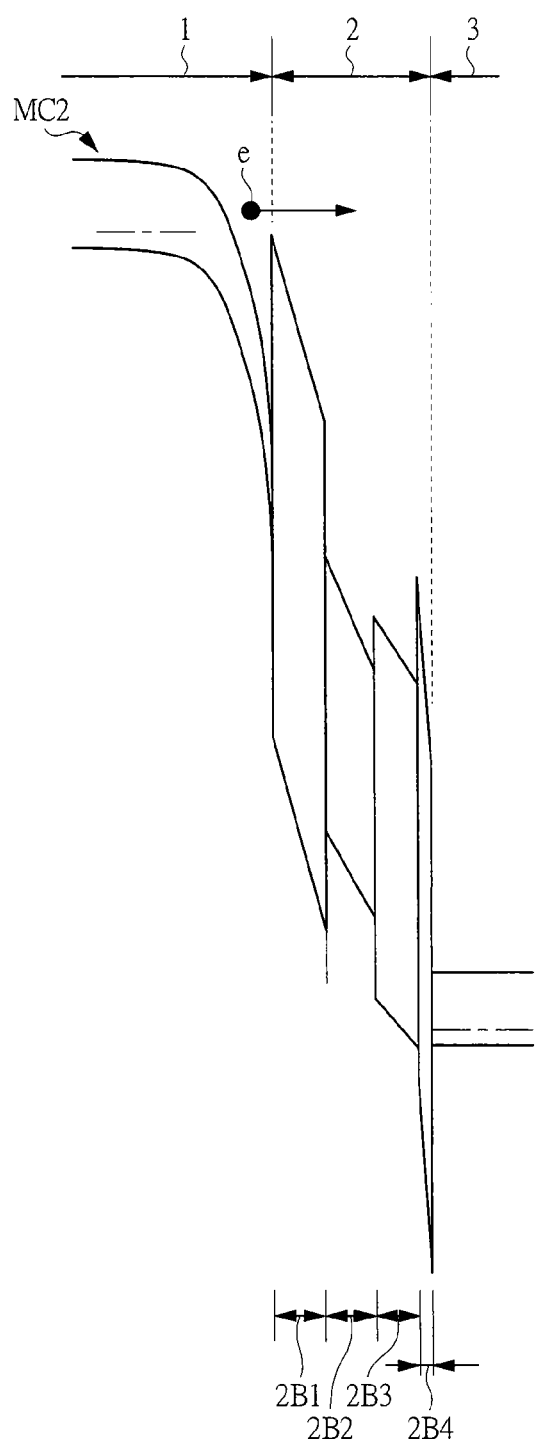
FIG. 12B is an explanatory diagram of a band structure in the electron injection of the gate dielectric having a charge-trapping layer of the non-volatile memory cell in FIG. 10.

FIG. 12 shows a comparison between the band structure in the electron injection of the gate dielectric 2 of the memory cell MC2 according to the first embodiment (FIG. 12B) and the band structure in the electron injection of the gate dielectric 2 of the memory cell MC0 with the MONOS structure shown in FIG. 1 which has been examined by the inventors of the present invention (FIG. 12A).

In both of the cases of the memory cell MC2 according to the first embodiment and the memory cell MC0 shown in FIG. 1, electrons e are injected into the insulators 2B2 and 2A2 by putting the electrons e into a hot-carrier state from the substrate 1 side. At this time, in order to supply the channel current to draw the electrons e to the gate electrode 3 side, positive potential (for example, 12V) is applied to the gate electrode 3.

FIG. 13 shows a comparison between the band structure in the hole injection of the gate dielectric 2 of the memory cell MC2 according to the first embodiment (FIG. 13B) and the band structure in the hole injection of the gate dielectric 2 of the memory cell MC0 with the MONOS structure which has been described by the inventors of the present invention (FIG. 13A).

As shown in FIG. 13A, in the structure of the memory cell MC0 in FIG. 1, holes h in a hot-carrier state are injected from the substrate 1 side. Therefore, negative potential (for example, −6V) is applied to the gate electrode 3.

On the other hand, in the memory cell MC2 according to the first embodiment, positive potential (for example, 8V) is applied to the gate electrode 3, and the holes h are injected into the insulator 2B2 from the gate electrode 3 side by tunneling through the insulator 2B3 by means of the F-N (Fowler-Nordheim) tunneling. The insulator 2B4 on the insulator 2B3 is provided mainly in order to improve the interfacial state with the polycrystalline silicon, and it is as thin as about 1 nm. Therefore, the holes h can penetrate through it by the direct tunneling. Therefore, it does not become a main factor to determine the hole penetration in the injection. Since the insulator 2B3 has a bandgap smaller than that of a silicon oxide film, F-N tunneling of the holes h can be achieved by small electric field.

On the other hand, in the charge-trapping state after injecting the holes h, since the bias is not applied to the gate electrode 3, the charges trapped in the insulator 2B2 cannot be discharged without penetrating through the laminated insulators 2B3 and 2B4. Therefore, it is possible to achieve good charge-trapping characteristics. It is effective to increase the field applied to the insulator 2B3 for performing the F-N tunneling through the insulator 2B3 formed of a silicon nitride film containing oxygen. Therefore, the field can be increased by setting the dielectric constant of the insulator 2B3 to be lower than that of the insulator 2B2 functioning as a charge-trapping layer. Since oxygen is contained in the insulator 2B3, the relative dielectric constant of the insulator 2B3 can be set to about 5.5, which makes it possible to have a difference from the insulator 2B2 with a relative dielectric constant of 7.5. Accordingly, the injection efficiency of the holes h can be improved.

On the substrate 1 side, the discharge of charges is suppressed by the insulator 2B1. In the structure of the memory cell MC0 shown in FIG. 1, electron and hole charges are injected from the channel side. Since holes which are hard to be accelerated in the channel in comparison to electrons are injected, a thick oxide film cannot be formed as the insulator 2B1. On the other hand, in the structure of the memory cell MC2 according to the first embodiment, only the electrons e in a hot-carrier state are injected from the substrate 1 side. Therefore, the insulator 2B1 can be formed sufficiently thick (thicker than the insulator 2A1). Accordingly, the charge-trapping characteristics of the memory cell MC2 can be improved.

In the first embodiment, the case where a film having an energy barrier to holes h lower than that of an oxide film can be formed from a nitride film containing oxygen (insulator 2B3) has been described. As another method, the same effect can be achieved when $Ta_2O_5$, $ZrO_2$, or $HfO_2$ is used as a material of the insulator 2B3 without using a nitride film.

As described above, in the memory cell MC2 according to the first embodiment, since the injection of the holes h to the charge-trapping layer (insulator 2B2) can be performed from the gate electrode 3 side, the operations can be achieved without the penetration of the holes h through the interface in contact to the channel and the insulator 2B1. Therefore, the deterioration in rewriting endurance and the charge-trapping characteristics due to the deterioration of the insulator 2B1 does not occur, and the memory cell MC2 having highly-efficient rewriting (writing and erasing) characteristics and stable charge-trapping characteristics can be provided.

Second Embodiment

As is apparent from the first embodiment, it is necessary to suppress the discharge by using an insulator having an energy barrier for the charge-trapping layer (insulator 2B2) in order to maintain the charge-trapping characteristics.

According to the first embodiment, the insulator 2B1 formed of a silicon oxide film is used for a lower side (substrate side) where the hot-carrier injection of electrons can be achieved. Therefore, good barrier characteristics can be obtained. Accordingly, in the second embodiment, a film structure capable of achieving both the charge-trapping characteristics and hole injection will be considered for an upper side (gate electrode side).

More specifically, by using a film having a large bandgap for a charge-trapping layer, a large band offset can be obtained. On the other hand, when considering the hole injection, it is required that the energy barrier from the gate electrode is lower than that of a silicon substrate and a silicon oxide film, or it is required that, as described in the first embodiment, although the energy barrier at an interface is high, it is actually low because of its extremely small film thickness. The laminated structure of an oxide film, a nitride film, and an oxide film described in the Non-Patent Document 8 by H. Lue et al. probably satisfies these conditions.

Figure 14:
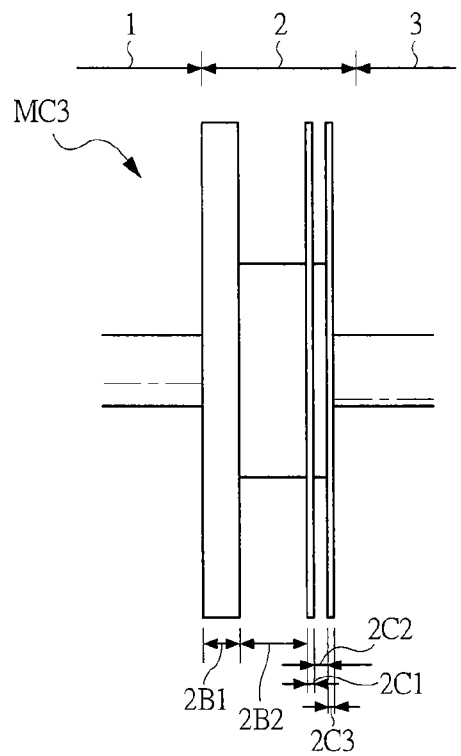
FIG. 14 is an explanatory diagram of the band structure of the gate dielectric having a charge-trapping layer of the non-volatile memory cell of the semiconductor device according to another embodiment (second embodiment) of the present invention.

In the second embodiment where it is applied, as shown in the band structure of FIG. 14, the laminated structure of the charge-trapping layer of the memory cell MC3 can be obtained from the laminated structure of the insulator 2B1 formed of a silicon oxide film, the insulator (charge-trapping layer) 2B2 formed of a silicon nitride film, an insulator 2C1 formed of a silicon oxide film, an insulator 2C2 formed of a silicon nitride film, and an insulator 2C3 formed of a silicon oxide film. In this case, the insulators 2C1, 2C2, and 2C3 are required to be formed of extremely thin films with a thickness of, for example, 2 nm or less.

Note that the basic structure of the memory cell MC3 according to the second embodiment is the same as that shown in FIG. 10 except for the structure of the gate dielectric 2. Also, FIG. 14 shows the flat-band state (state where no bias is applied to the gate dielectric 2 between the gate electrode 3 and the substrate 1, that is, state where electric field of the gate dielectric 2 having no charge is zero or electric field of the channel surface is zero).

According to the second embodiment as described above, it is possible to achieve both the charge-trapping characteristics and the hole injection of the memory cell MC3.

Third Embodiment

The first embodiment has described that the energy barrier can be provided to the charge-trapping layer (insulator 2B2) by forming a silicon nitride film containing oxygen.

Figure 15:
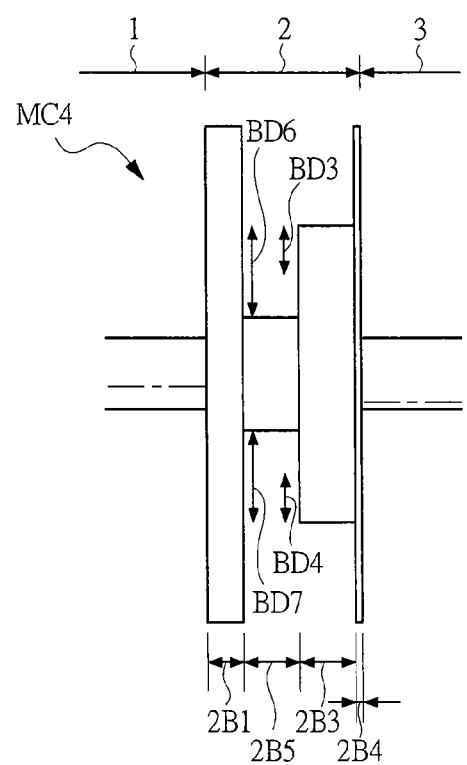
FIG. 15 is an explanatory diagram of the band structure of the gate dielectric having a charge-trapping layer of the non-volatile memory cell of the semiconductor device according to another embodiment (third embodiment) of the present invention.

In the third embodiment, the case where a charge-trapping layer of a memory cell is formed of a silicon nitride film having large silicon composition will be described. The silicon nitride film having large silicon composition has a bandgap smaller than that of a (normal) silicon nitride film of stoichiometric composition. The band structure of the gate dielectric 2 in this case is shown in FIG. 15. Also, FIG. 15 shows the flat-band state (state where no bias is applied to the gate dielectric 2 between the gate electrode 3 and the substrate 1, that is, state where electric field of the gate dielectric 2 having no charge is zero or electric field of the channel surface is zero).

In the memory cell MC4 according to the third embodiment, the insulator 2B5 functioning as a charge-trapping layer is formed between the insulator 2B1 and the insulator 2B3. Similar to the insulator 2B2 in the first and second embodiments, the insulator 2B5 is formed of, for example, a silicon nitride film. However, the silicon composition (ratio) of the insulator 2B5 is different from that of the insulator 2B2 in the above-described first and second embodiments. More specifically, the silicon composition (ratio) of the insulator 2B5 is larger than the silicon composition (ratio) of the silicon nitride film (insulator 2B2) of stoichiometric composition. The insulator 2B5 having large silicon composition can be formed by reducing $NH_3$ flow rate when it is deposited by the CVD method using $SiH_2Cl_2$ and $NH_3$ as material gas.

By reducing the bandgap of the insulator 2B5 functioning as a charge-trapping layer, the barrier height (band offsets BD6 and BD7) with the insulator 2B3 functioning as a charge escape preventing layer can be increased.

The band offsets BD3 and BD4 in FIG. 15 show the energy barriers (0.5 eV and 0.8 eV) to electrons and holes when a normal silicon nitride film is used, and the band offsets BD6 and BD7 in FIG. 15 show the energy barriers (0.7 eV and 1.0 eV) to electrons and holes when the above-described insulator 2B5 having large silicon composition is used. Note that the basic structure of the memory cell MC4 according to the third embodiment is the same as that shown in FIG. 10 except for the structure of the gate dielectric 2.

According to the third embodiment described above, while maintaining the hole injection from the gate electrode 3 to the insulator 2B2 at the same level as that of the first embodiment, the charge-trapping characteristics of the memory cell MC4 can be improved more than the first embodiment.

Fourth Embodiment

Figure 16:
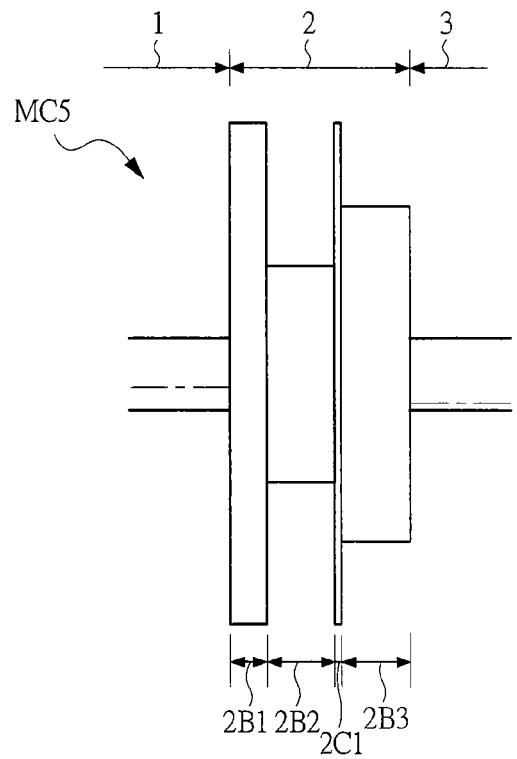
FIG. 16 is an explanatory diagram of the band structure of the gate dielectric having a charge-trapping layer of the non-volatile memory cell of the semiconductor device according to another embodiment (fourth embodiment) of the present invention.

FIG. 16 is an explanatory diagram showing the band structure of the gate dielectric 2 of a memory cell MC5 of a semiconductor device according to the fourth embodiment. Note that FIG. 16 shows the flat-band state (state where no bias is applied to the gate dielectric 2 between the gate electrode 3 and the substrate 1, that is, state where electric field of the gate dielectric 2 having no charge is zero or electric field of the channel surface is zero).

In the fourth embodiment, the gate dielectric 2 of the memory cell MC5 is formed by laminating the insulator 2B1, the insulator 2B2, the insulator 2C1, and the insulator 2B3 in this order from the main surface of the substrate 1. As described above, the insulator 2C1 is formed of, for example, a silicon oxide film, and it is formed to be thinner than the insulators 2B2 and 2B3. Further, as described above, the insulator 2B3 is formed of, for example, a silicon nitride film containing oxygen. Note that the basic structure of the memory cell MC5 according to the fourth embodiment is the same as that shown in FIG. 10 except for the structure of the gate dielectric 2.

According to the fourth embodiment, by forming the insulator 2C1 having high energy barrier on the insulator 2B2 functioning as a charge-trapping layer of the gate dielectric 2 of the memory cell MC5, the charge-trapping characteristics can be improved. Note that, also in the fourth embodiment, holes can be appropriately injected from the gate electrode 3 into the insulator 2B2.

In the fourth embodiment, the case where the gate electrode 3 is provided on the insulator 2B3 has been shown as an example. However, the case where the insulator 2B4 (or insulator 2C3) formed of a silicon oxide film is formed on the insulator 2B3 and the gate electrode 3 is formed further thereon is also preferable.

Fifth Embodiment

In the fifth embodiment, the case where a charge-trapping layer formed of a silicon-rich insulator similar to that described in the third embodiment is formed for the structure described in the fourth embodiment will be described.

Figure 17:
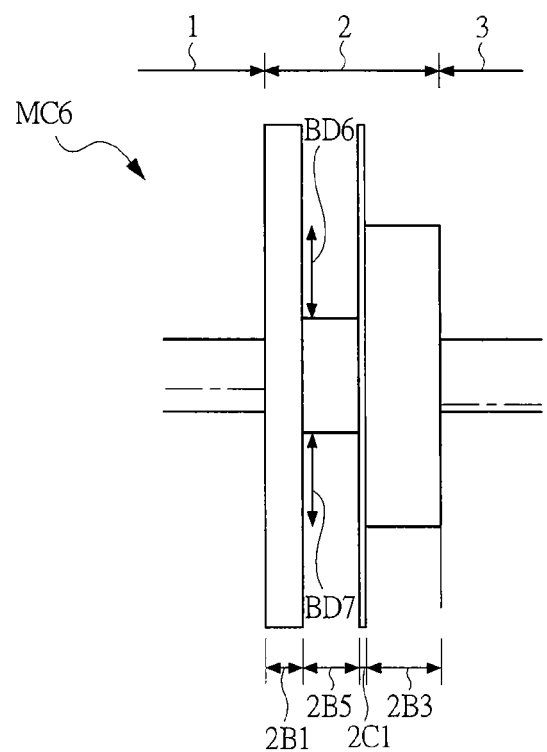
FIG. 17 is an explanatory diagram of the band structure of the gate dielectric having a charge-trapping layer of the non-volatile memory cell of the semiconductor device according to another embodiment (fifth embodiment) of the present invention.

FIG. 17 is an explanatory diagram of the band structure of the gate dielectric 2 of a memory cell MC6 of a semiconductor device according to the fifth embodiment. Note that FIG. 17 shows the flat-band state (state where no bias is applied to the gate dielectric 2 between the gate electrode 3 and the substrate 1, that is, state where electric field of the gate dielectric 2 having no charge is zero or electric field of the channel surface is zero).

In the fifth embodiment, similar to the third embodiment, the charge-trapping layer of the memory cell MC6 is formed of the insulator 2B5 formed of a silicon nitride film having large silicon composition. By this means, the bandgap of the insulator 2B5 is smaller than that of a (normal) silicon nitride film of stoichiometric composition.

Note that the basic structure of the memory cell MC6 according to the fifth embodiment is the same as that shown in FIG. 10 except for the structure of the gate dielectric 2. Further, the laminated structure of the gate dielectric 2 other than that described above is the same as that described in the fourth embodiment.

According to the fifth embodiment as described above, since a film having high energy barrier is provided on the charge-trapping layer and the energy barrier height (band offsets BD6 and BD7) of the charge-trapping layer and the upper insulator 2C1 can be increased, the charge-trapping characteristics can be improved. Note that, also in the fifth embodiment, holes can be appropriately injected from the gate electrode 3 into the insulator 2B5.

Sixth Embodiment

Figure 3A:
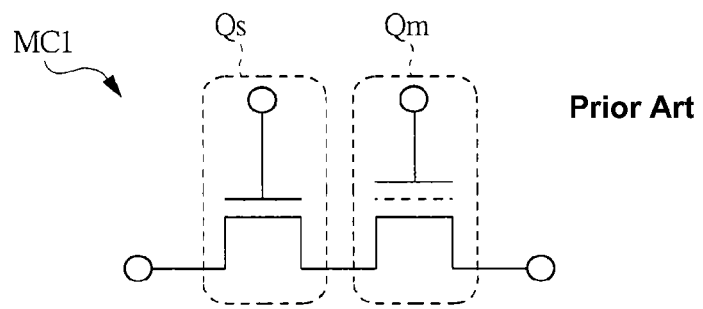
FIG. 3A is an equivalent circuit diagram of a non-volatile memory cell having a select transistor and a memory transistor.
Figure 3B:
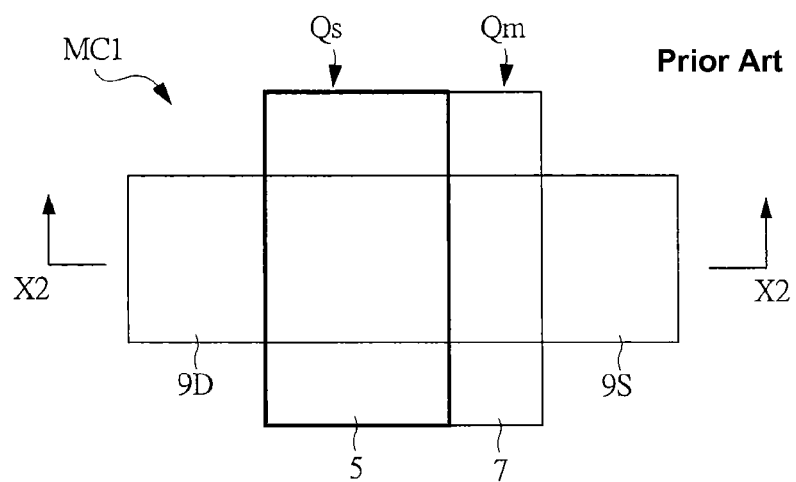
FIG. 3B is a plan view of the non-volatile memory cell corresponding to the circuit shown in FIG. 3A.
Figure 3C:
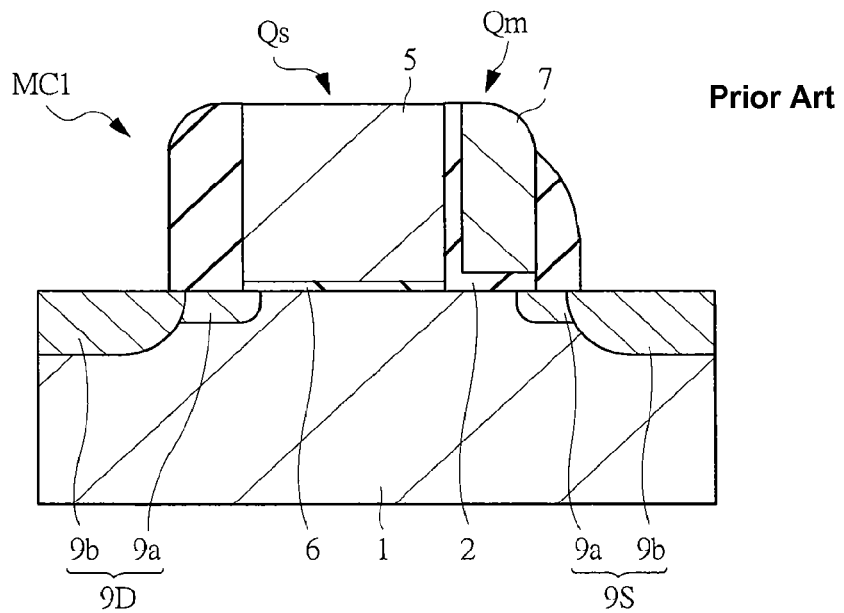
FIG. 3C is a cross-sectional view taken along the line X2-X2 in FIG. 3B.

To make the most of the feature of the embodiment, it is effective to improve the electron injection efficiency while having a thick lower oxide film in a charge-trapping layer of a memory cell. It is effective that the laminated structure of the gate dielectric 2 of the embodiment is used for the split-gate memory cell structure described with reference to FIG. 3, and holes are injected from the gate electrode side.

Figure 4:
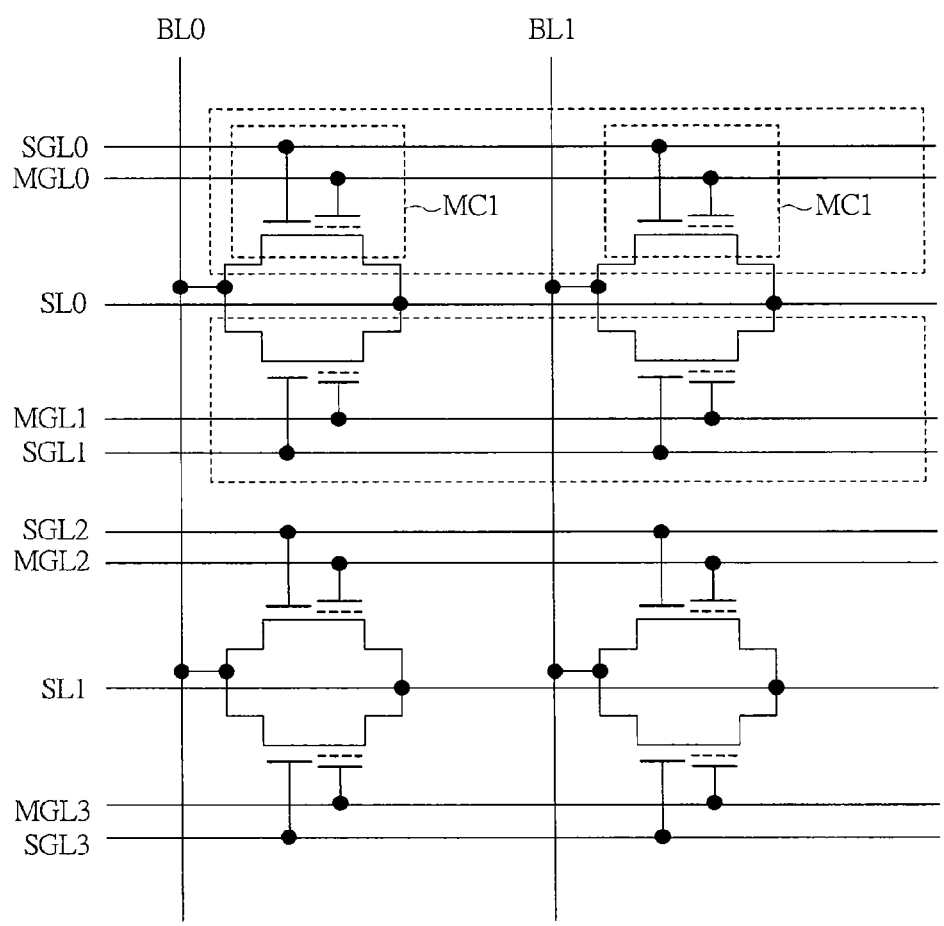
FIG. 4 is a circuit diagram showing an example in the case where a memory cell array is formed by using the non-volatile memory cells in FIG. 3.
Figure 5:
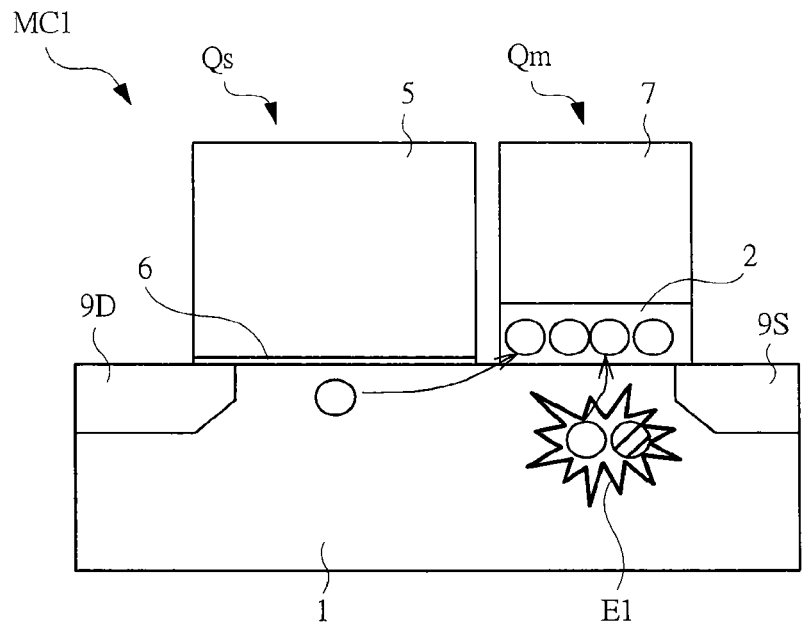
FIG. 5 is an explanatory diagram of the typical writing operation of the non-volatile memory cell in FIG. 3.
Figure 6:
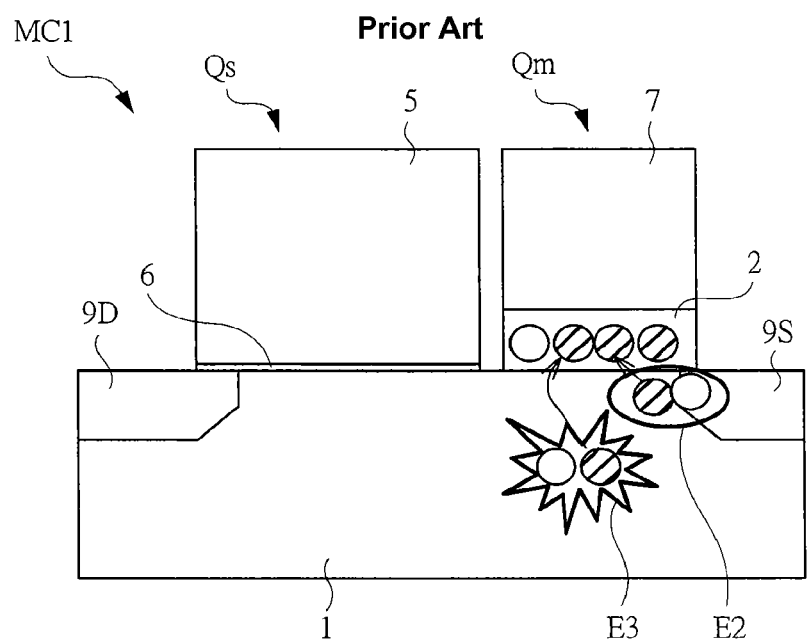
FIG. 6 is an explanatory diagram of the typical erasing operation of the non-volatile memory cell in FIG. 3.
Figure 18:
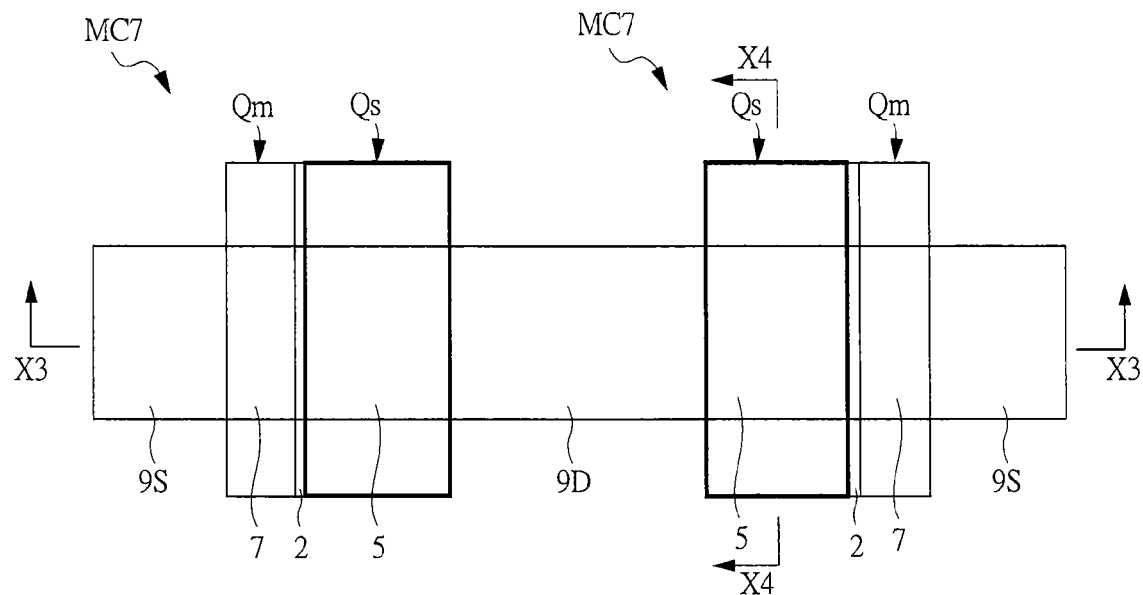
FIG. 18 is an explanatory diagram of the band structure of the gate dielectric having a charge-trapping layer of the non-volatile memory cell of the semiconductor device according to another embodiment (sixth embodiment) of the present invention.
Figure 19:
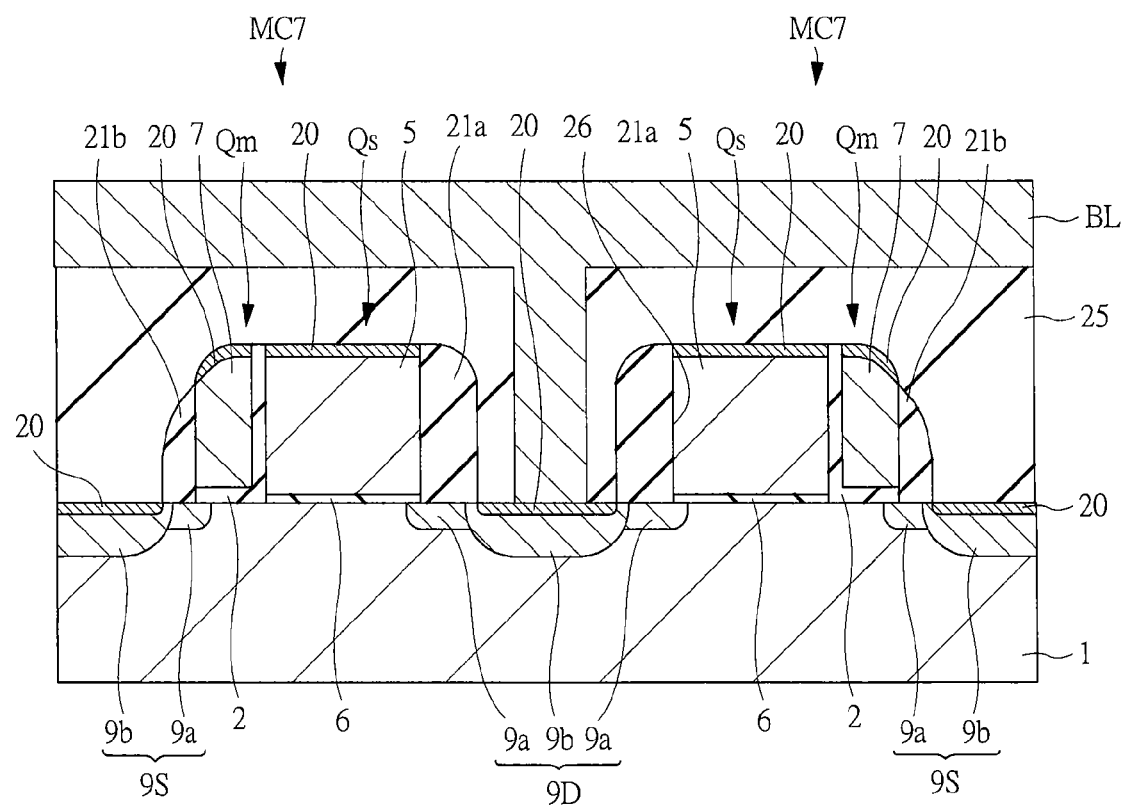
FIG. 19 is a cross-sectional view taken along the line X3-X3 in FIG. 18.
Figure 20:
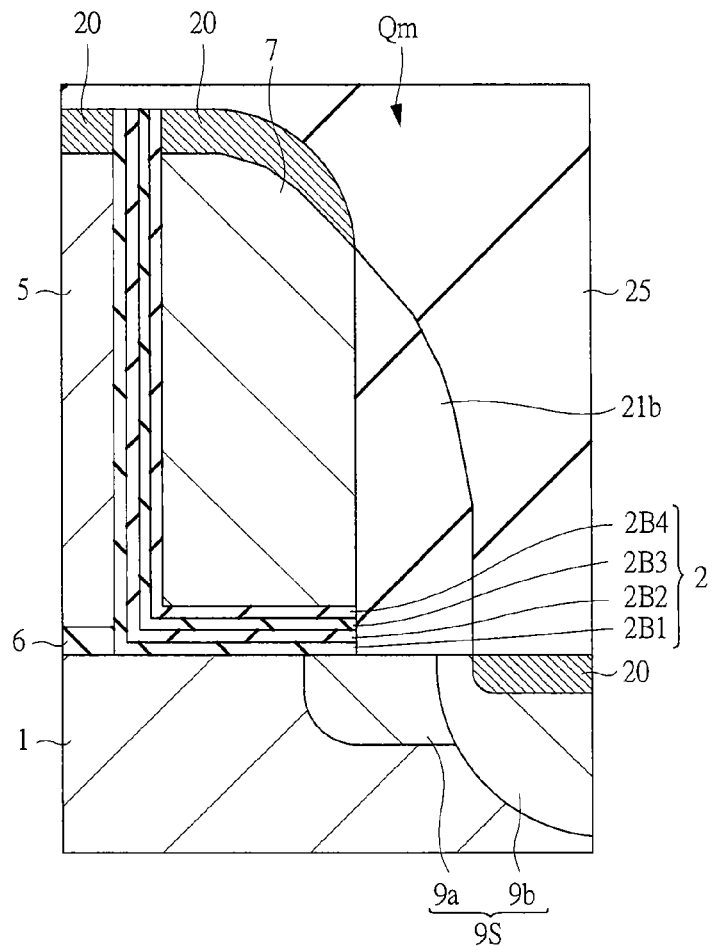
FIG. 20 is an enlarged cross-sectional view showing the principal parts of the non-volatile memory cell in FIG. 19.
Figure 21:
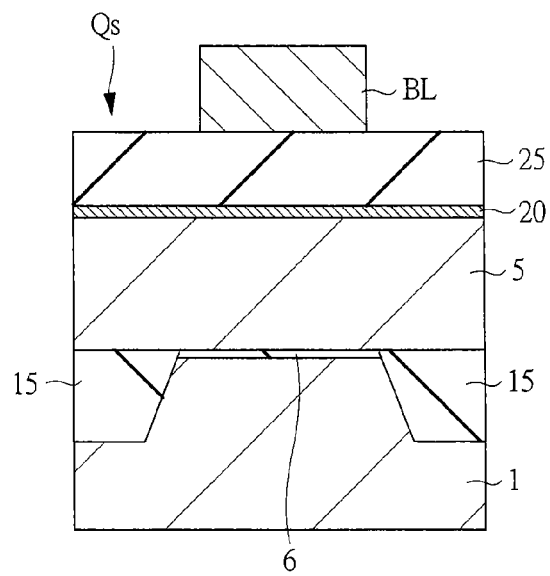
FIG. 21 is a cross-sectional view taken along the line X4-X4 in FIG. 18.

FIG. 18 to FIG. 21 show the case where the laminated structure of the gate dielectric 2 described in the first embodiment is applied to the gate dielectric of a memory transistor. FIG. 18 is a plan view of a memory cell MC7 according to the sixth embodiment, FIG. 19 is a cross-sectional view taken along the line X3-X3 in FIG. 18, FIG. 20 is an enlarged cross-sectional view showing principal parts of the memory cell MC7 of FIG. 19, and FIG. 21 is a cross-sectional view taken along the line X4-X4 in FIG. 18. Note that the circuit diagram of the memory cell MC7 is equal to that shown in FIG. 3A. Further, the circuit structure of the memory cell array using the memory cells MC7 is equal to that shown in FIG. 4. Also, the band structure of the gate dielectric 2 is equal to that described in the first embodiment.

The memory cell MC7 according to the sixth embodiment has a select transistor (second insulator gate field effect transistor) Qs and a memory transistor (first insulator gate field effect transistor, non-volatile memory element) Qm. The select transistor Qs and the memory transistor Qm are electrically connected in series. The select transistor Qs and the memory transistor Qm are disposed adjacent to each other on the first main surface of the substrate 1.

The gate electrode (second gate electrode) 5 of the select transistor Qs is formed on the first main surface of the substrate 1 via a gate dielectric (second gate dielectric) 6. The gate electrode 5 is made of, for example, low-resistance polycrystalline silicon, and a silicide layer 20 made of, for example, tungsten silicide is formed on the gate electrode 5. The memory transistor Qm is selected depending on the voltage applied to the gate electrode 5. Also, a sidewall 21a formed of, for example, a silicon oxide film is formed on one side surface of the gate electrode 5. The gate dielectric 6 is formed of, for example, a silicon oxide film.

On the other hand, the gate electrode (first gate electrode) 7 of the memory transistor Qm is formed on the main first main surface of the substrate 1 and on the other side surface of the gate electrode 5 of the select transistor Qs via the gate dielectric (first gate dielectric) 2. The gate electrode 7 is formed only on the side surface of the gate electrode 5, and the upper surface thereof is processed and roundly tapered. Also, the gate electrode 7 is made of, for example, low-resistance p type polycrystalline silicon. This is because, since holes are injected into the charge-trapping layer from the side of the gate electrode 3 in this embodiment, it is necessary to improve the hole injection efficiency. The silicide layer 20 made of, for example, tungsten silicide is formed on the upper surface of the gate electrode 7. Further, a sidewall 21b formed of, for example, a silicon oxide film is formed on one side of the gate electrode 7.

Similar to the first embodiment described above, the gate dielectric 2 is formed by laminating the insulator 2B1 formed of, for example, a silicon oxide film, the insulator 2B2 formed of, for example, a silicon nitride film, the insulator 2B3 formed of, for example, a silicon nitride film containing oxygen, and the insulator 2B4 formed of, for example, a silicon oxide film in this order on the first main surface of the substrate 1 and the side surface of the gate electrode 7. The gate dielectric 2 insulates the gate electrode 7 from the substrate 1 and the gate electrode 5.

Further, in the main surface of the substrate 1, the diffusion layer for drain (second diffusion layer) 9D is formed on one side of the gate electrode 5 and the diffusion layer for source (first diffusion layer) 9S is formed on one side of the gate electrode 7. More specifically, in the first main surface of the substrate 1, the diffusion layer 9S, the first channel controlled by the gate electrode 7, the second channel controlled by the gate electrode 5, and the diffusion layer 9D are arranged in an arrangement direction of the gate electrodes 5 and 7.

Each of the diffusion layers 9D and 9S has the low-impurity concentration diffusion layer 9a having a relatively low impurity concentration and the high-impurity concentration diffusion layer 9b having a relatively high impurity concentration. The diffusion layer 9a is formed on the channel side, and the diffusion layer 9b is formed at a position apart from the channel by the length of the diffusion layer 9a in a state of being electrically connected to the diffusion layer 9a. Further, the silicide layer 20 made of, for example, tungsten silicide is formed on the upper surface of the diffusion layer 9b. The case where the diffusion layer 9D for drain is shared by the adjacent memory cells MC7 is shown here.

An insulator 25 formed of, for example, a silicon oxide film is deposited on the first main surface of the substrate 1 so as to cover the gate electrodes 5 and 7, the sidewalls 21a and 21b, the diffusion layers 9S and 9D, and the element isolation region 15. Bit lines BL are formed on the insulator 25. The bit line BL is made of metal such as aluminum and is electrically connected to the diffusion layer 9D through a contact hole 26 formed in the insulator 25.

In the memory cell MC7 as described above, the change in voltage characteristics of the current flowing between the diffusion layers 9S and 9D by the gate electrode 7 corresponds to the stored data. Also in the sixth embodiment, electrons and holes are used as trapped charges to the gate dielectric 2 used as a charge-trapping layer, and the electrons are injected from the substrate 1 side and the holes are injected from the gate electrode 7 side. The electrons form a high-field region in the channel between the gate electrodes 7 and 5 by the memory transistor Qm and the select transistor Qs and are injected into the gate dielectric 2 by the source side injection.

In this case, since the laminated film according to the embodiment is used for the gate dielectric 2 of the memory transistor Qm, the erasing operation of the memory cell MC7 differs from that described above. More specifically, in the erasing operation, positive potential of 15V is applied to the gate electrode 7 of the memory transistor Qm, and 0V is applied to the diffusion layer 9S for source, the diffusion layer 9D for drain, the gate electrode 5 of the select transistor Qs, and the substrate 1. By this means, holes are injected into the charge-trapping layer (insulator 2B2) from the gate electrode 7. The writing and reading operations are the same as those described above.

In this method, it is not necessary to put the holes into a hot-carrier state in the erasing. Therefore, different from the erasing method described above, the large erasing current does not flow. Accordingly, the data in a large plurality of memory cells can be erased at a time. Further, since it is not necessary to apply negative potential to the gate electrode 7 of the memory transistor Qm in all of the memory cell operations such as writing, erasing, trapping, and reading, the driving circuit structure of the gate electrode 7 can be simplified. Further, since it is possible to efficiently inject the holes in the erasing, the threshold value can be lowered. Therefore, in the memory cell MC7 according to the sixth embodiment in which the memory cell can be selected by the select transistor Qs, the gate electrode 7 of the memory transistor Qm can be read with 0V. Since the state where no bias is applied to the gate electrode 7 of the memory transistor Qm is maintained except for the writing and erasing operations, it is effective for the charge trapping.

Next, an example of a manufacturing method of the semiconductor device according to the sixth embodiment will be described with reference to FIG. 22 to FIG. 30. FIG. 22 to FIG. 30 are cross-sectional views showing the principal parts of the memory region in the manufacturing process of the semiconductor device according to the sixth embodiment, and the cross-sectional views on the left side correspond to those taken along the line X3-X3 in FIG. 18 and the cross-sectional views on the right side correspond to those taken along the line X4-X4 in FIG. 18. The process of so-called 0.13-micron generation is used as an example in the following description.

Figure 22:
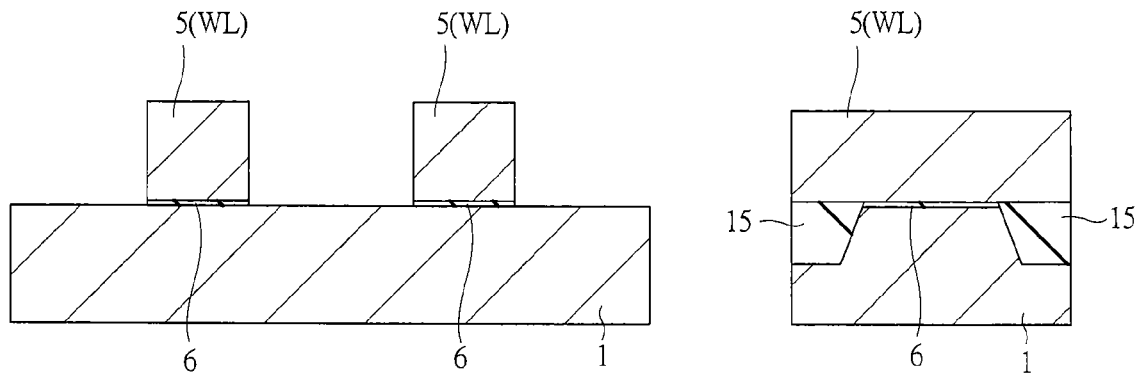
FIG. 22 is a cross-sectional view showing the principal parts of the memory region in the manufacturing process of the semiconductor device in FIG. 18, in which the sectional view on the left side corresponds to that taken along the line X3-X3 in FIG. 18 and the sectional view on the right side corresponds to that taken along the line X4-X4 in FIG. 18.

First, as shown in FIG. 22, the active region and the element isolation region 15 are formed in the first main surface of the substrate 1 (in this step, circular semiconductor thin plate called semiconductor wafer) through the well-known shallow trench isolation (STI) process.

Subsequently, a silicon surface is exposed in the active region, and the first main surface of the substrate 1 is subjected to the thermal treatment. By doing so, the gate dielectric 6 with a thickness of, for example, 2.5 nm is formed. Then, after polycrystalline silicon of about 200 nm is deposited by the CVD method and patterned by the select gate patterns, the polycrystalline silicon is etched to form the gate electrode 5 (word line WL) of the select transistor. At this time, though not shown here, the gate electrode of the MOSFET of the arithmetic circuit can be processed simultaneously on the first main surface of the same substrate 1.

Figure 23:
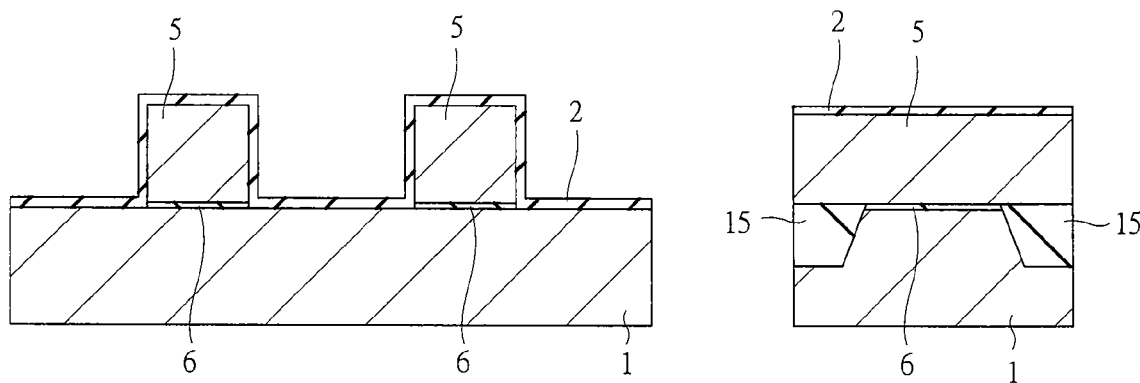
FIG. 23 is a cross-sectional view showing the principal parts of the memory region in the manufacturing process of the semiconductor device in FIG. 18 continued from FIG. 22, in which the sectional view on the left side corresponds to that taken along the line X3-X3 in FIG. 18 and the sectional view on the right side corresponds to that taken along the line X4-X4 in FIG. 18.

Subsequently, after removing the gate dielectric 6 in the memory transistor formation region, as shown in FIG. 23, the gate dielectric 2 is formed so as to cover the first main surface of the substrate 1 and the surface of the gate electrode 5 in the same manner as that described in the first embodiment. More specifically, after about 4 nm of the first main surface of the exposed substrate 1 is oxidized to form the insulator 2B1 formed of a silicon oxide film, about 4 nm of the insulator 2B2 formed of a silicon nitride film is deposited thereon by the CVD method. Subsequently, after about 4 nm of the insulator 2B3 formed of a silicon nitride film containing oxygen is deposited on the insulator 2B2 by the CVD method, about 1 nm of the insulator 2B4 formed of a silicon oxide film is deposited further thereon by the CVD method (see FIG. 20). Note that, since the insulators 2B1, 2B2, 2B3, and 2B4 are thin, they are collectively referred to as the gate dielectric 2.

Figure 24:
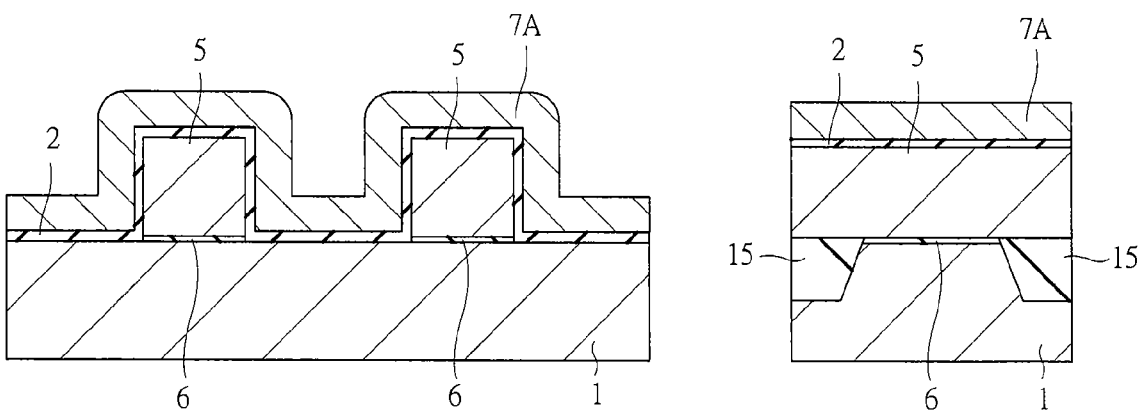
FIG. 24 is a cross-sectional view showing the principal parts of the memory region in the manufacturing process of the semiconductor device in FIG. 18 continued from FIG. 23, in which the sectional view on the left side corresponds to that taken along the line X3-X3 in FIG. 18 and the sectional view on the right side corresponds to that taken along the line X4-X4 in FIG. 18.

Then, as shown in FIG. 24, about 700 nm of a p type polycrystalline silicon film 7A which is in-situ doped with boron (B) to high concentration is deposited on the first main surface of the substrate 1 by the CVD method.

Figure 25:
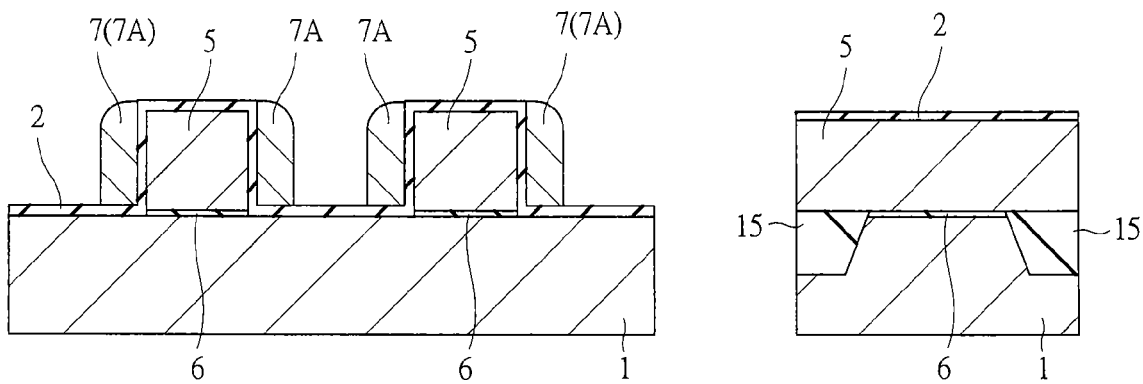
FIG. 25 is a cross-sectional view showing the principal parts of the memory region in the manufacturing process of the semiconductor device in FIG. 18 continued from FIG. 24, in which the sectional view on the left side corresponds to that taken along the line X3-X3 in FIG. 18 and the sectional view on the right side corresponds to that taken along the line X4-X4 in FIG. 18.

Subsequently, the polycrystalline silicon film 7A is anisotropically etched. By doing so, as shown in FIG. 25, the gate electrode 7 for the memory transistor in the shape of a spacer is formed on the side surface of the gate electrode 5 for the select transistor. At this time, a photoresist pattern (mask) is formed at a portion in contact to the upper-layer wiring in the gate electrode 7. Further, though not shown here, additional etching can be performed so as to remove the polycrystalline silicon film 7A from the protruded side surface of the unnecessary part.

Figure 26:
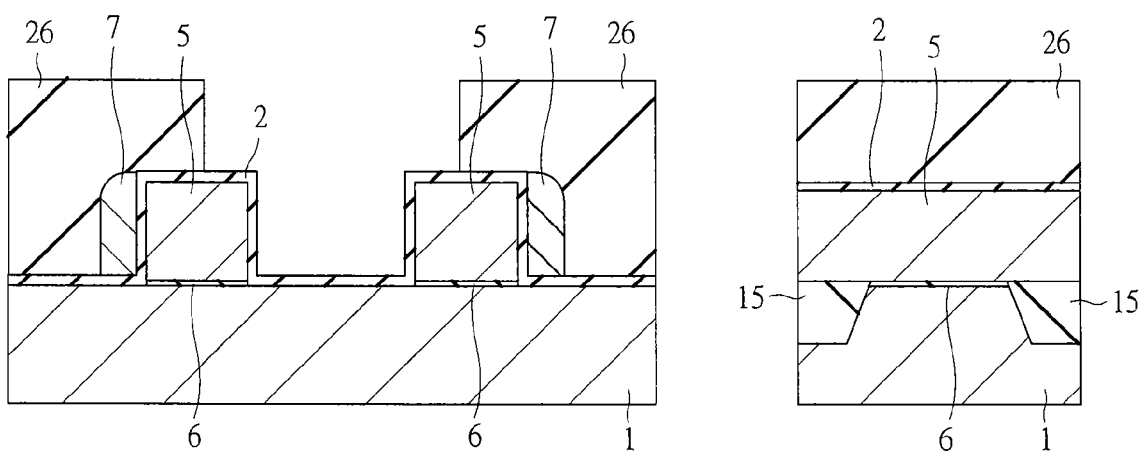
FIG. 26 is a cross-sectional view showing the principal parts of the memory region in the manufacturing process of the semiconductor device in FIG. 18 continued from FIG. 25, in which the sectional view on the left side corresponds to that taken along the line X3-X3 in FIG. 18 and the sectional view on the right side corresponds to that taken along the line X4-X4 in FIG. 18.

Thereafter, since the gate electrode 7 for the memory transistor is required to be formed only on one side of the gate electrode 5 for the select transistor, the unnecessary polycrystalline silicon film 7A is removed by etching as shown in FIG. 26. The reference numeral 26 denotes an etching protective pattern formed of photoresist. At this time, the gate dielectric 2 can be used as an underlayer protective layer.

Figure 27:
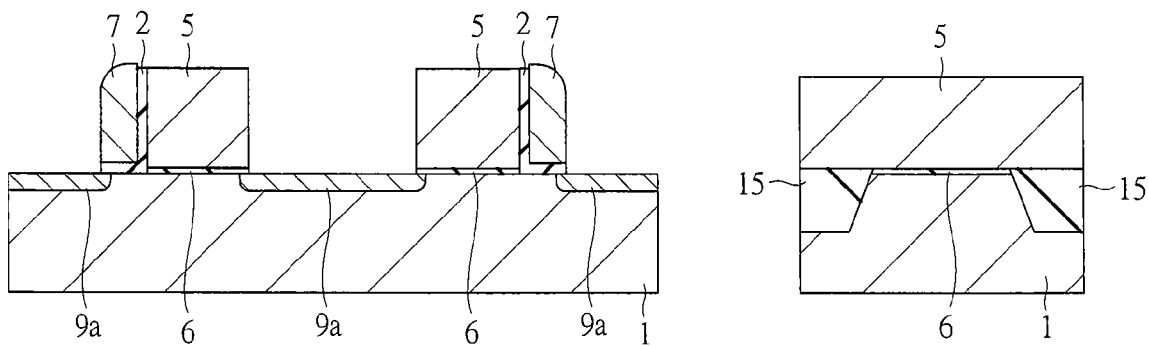
FIG. 27 is a cross-sectional view showing the principal parts of the memory region in the manufacturing process of the semiconductor device in FIG. 18 continued from FIG. 26, in which the sectional view on the left side corresponds to that taken along the line X3-X3 in FIG. 18 and the sectional view on the right side corresponds to that taken along the line X4-X4 in FIG. 18.

Then, after removing the protective pattern 26, as shown in FIG. 27, the exposed gate dielectric 2 (part of the gate dielectric 2 not covered with the gate electrode 7) is removed by etching and then exposed surface is cleaned.

Subsequently, the substrate 1 is subjected to the thermal treatment to form a silicon oxide film with a thickness of 2 nm on the main surface of the substrate 1 (not shown). Thereafter, patterning using the photoresist is performed, and arsenic (As) is ion-implanted into the diffusion layer region on the side of the gate electrode 7 for the memory transistor with the energy of 10 keV and the dose amount of $10^{15}$ cm$^{-2}$, thereby forming the diffusion layer 9a.

Figure 28:
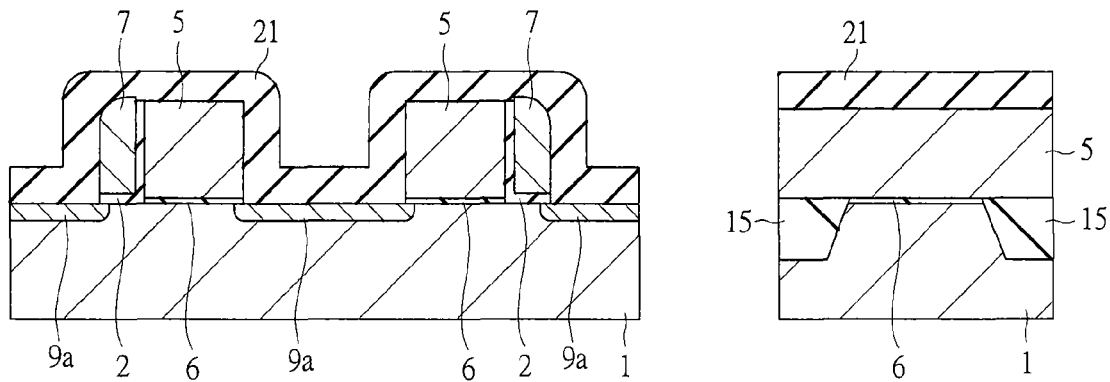
FIG. 28 is a cross-sectional view showing the principal parts of the memory region in the manufacturing process of the semiconductor device in FIG. 18 continued from FIG. 27, in which the sectional view on the left side corresponds to that taken along the line X3-X3 in FIG. 18 and the sectional view on the right side corresponds to that taken along the line X4-X4 in FIG. 18.

Next, as shown in FIG. 28, a silicon oxide film 21 to be a spacer is deposited to about 100 nm on the first main surface of the substrate 1. This is the well-known LDD (Lightly Doped Drain) process, and MOSFETs of the peripheral circuits of the non-volatile memory and other arithmetic circuits can be formed simultaneously. In other words, the MOSFETs of the peripheral arithmetic circuit also have the structure in which the low impurity concentration diffusion layer 9a is formed on both sides of the channel.

Figure 29:
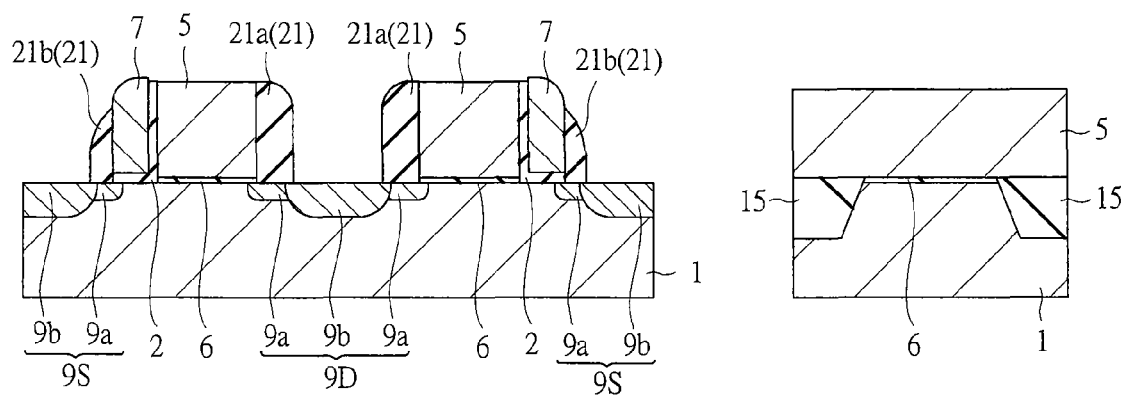
FIG. 29 is a cross-sectional view showing the principal parts of the memory region in the manufacturing process of the semiconductor device in FIG. 18 continued from FIG. 28, in which the sectional view on the left side corresponds to that taken along the line X3-X3 in FIG. 18 and the sectional view on the right side corresponds to that taken along the line X4-X4 in FIG. 18.

Subsequently, by performing the anisotropic dry etching process for the silicon oxide film 21, the sidewalls 21a and 21b are formed on one sidewalls of the gate electrode 5 for the select transistor and the gate electrode 7 for the memory transistor as shown in FIG. 29.

Thereafter, arsenic (As) is introduced by the ion-implantation method into the first main surface of the substrate 1 with using the gate electrodes 5 and 7 and the sidewalls 21a and 21b as masks, thereby forming the diffusion layer 9b. At the same time with this impurity doping, the impurity can be doped into the gate electrode 5 for the select transistor. Note that the MOSFETs of the peripheral circuits of the non-volatile memory and other arithmetic circuits also have the structure in which the high impurity concentration diffusion layer 9b is formed on both sides of the channel via the diffusion layer 9a.

Figure 30:
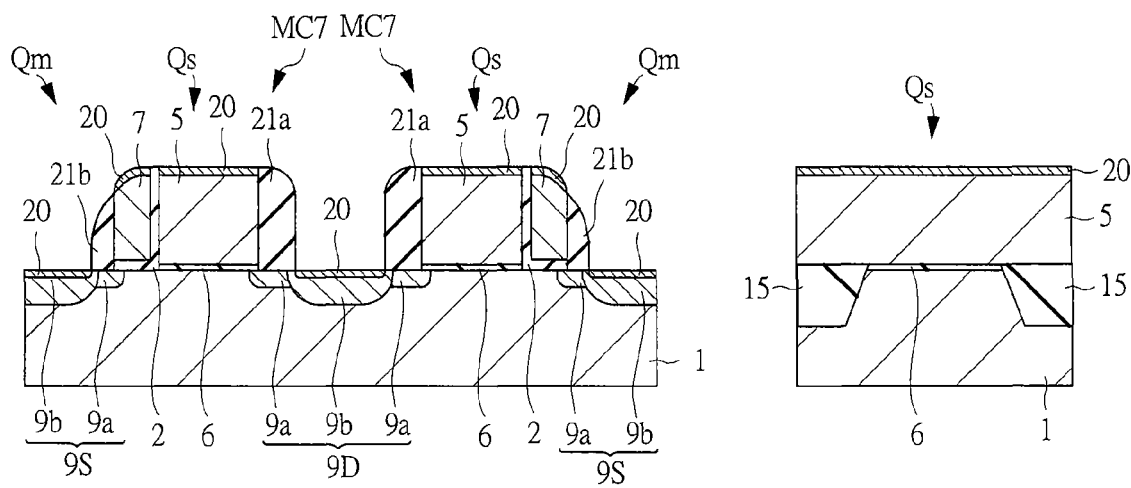
FIG. 30 is a cross-sectional view showing the principal parts of the memory region in the manufacturing process of the semiconductor device in FIG. 18 continued from FIG. 29, in which the sectional view on the left side corresponds to that taken along the line X3-X3 in FIG. 18 and the sectional view on the right side corresponds to that taken along the line X4-X4 in FIG. 18.

Next, as shown in FIG. 30, the silicide layer 20 is formed on the upper surfaces of the gate electrode 5 for the select transistor, the gate electrode 7 for the memory transistor, the diffusion layers 9b for source and drain, and the drain diffusion layer 9b through the well-known silicide process. Note that the silicide layer 20 is formed also on the upper surfaces of the gate electrodes of the MOSFETs of the peripheral circuits of the non-volatile memory and other arithmetic circuits and the diffusion layers for source and drain.

In this manner, the select transistor Qs and the memory transistor Qm are formed, and the memory cell MC7 having the split gate structure in which holes are injected into the charge-trapping layer of the gate dielectric 2 from the gate electrode 7 side in the erasing is formed. Thereafter, by applying the wiring process according to the normal CMOS (Complementary Metal Oxide Semiconductor) process, the semiconductor device 1 shown in FIG. 18 to FIG. 21 is manufactured.

Figure 31:
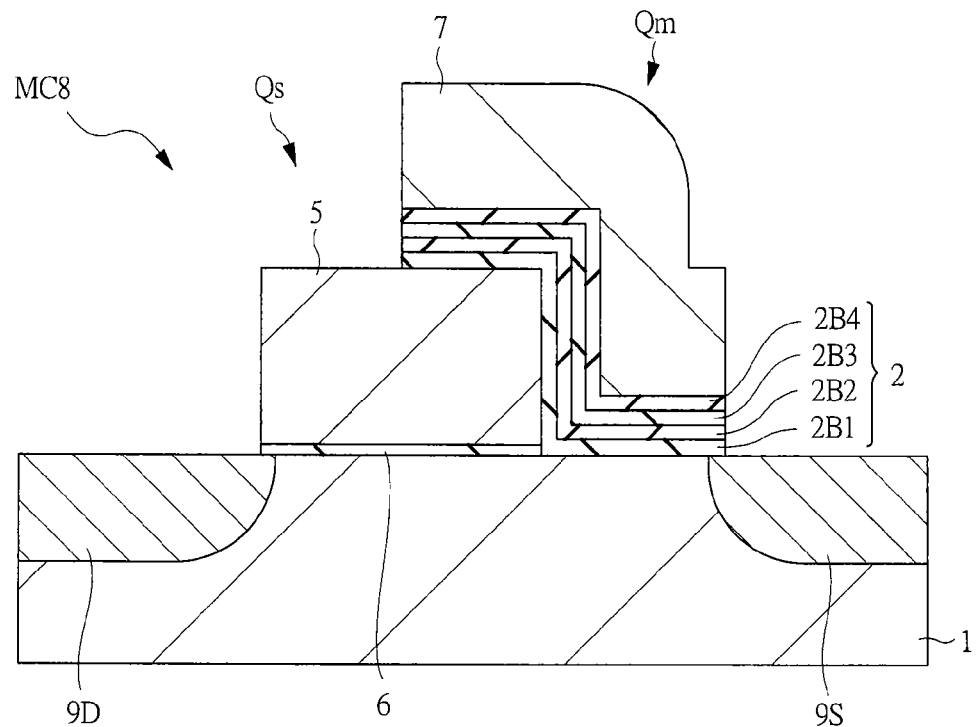
FIG. 31 is a cross-sectional view showing a non-volatile memory cell of a semiconductor device according to still another embodiment of the present invention.

The case where the gate electrode 7 of the memory transistor Qm is formed in a self-alignment manner has been described here. However, like the memory cell MC8 shown in FIG. 31, it is also possible to perform the patterning so that the gate electrode 7 of the memory transistor Qm is formed on the side surface of the gate electrode 5 of the select transistor Qs and on the upper surface of the gate electrode 5. In this case, the stability of the hole injection in the erasing operation can be improved in comparison to the structure described in the sixth embodiment.

Seventh Embodiment

In the seventh embodiment, a structure example in which the gate electrode for the select transistor and the gate electrode for the memory transistor of the memory cell described in the sixth embodiment are exchanged will be described.

Figure 32:
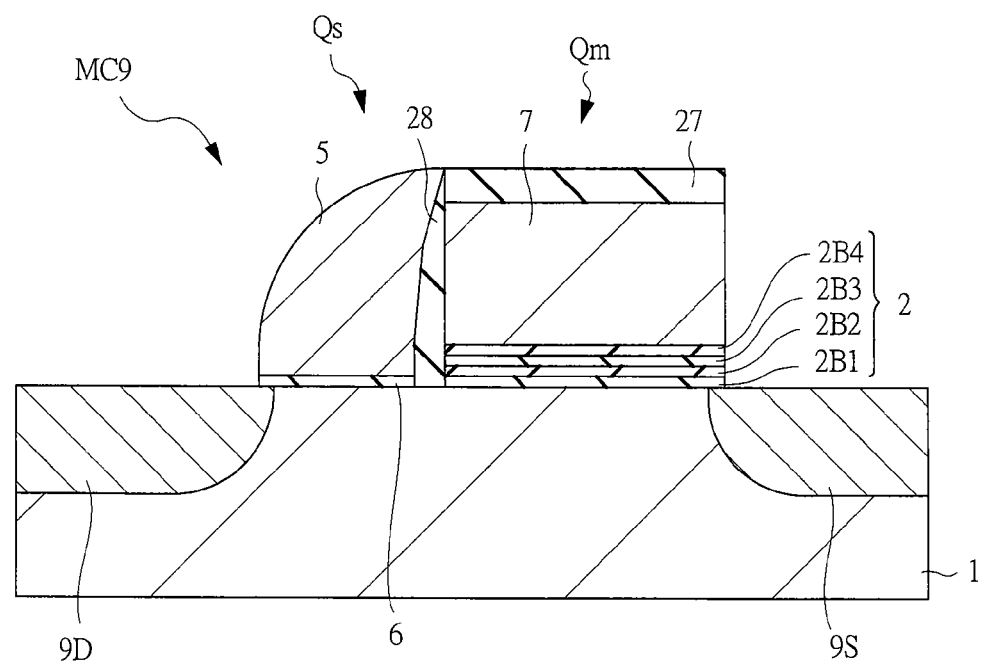
FIG. 32 is a cross-sectional view of a non-volatile memory cell of a semiconductor device according to another embodiment (seventh embodiment) of the present invention.

FIG. 32 is a cross-sectional view showing the principal parts of the memory cell MC9 of the semiconductor device according to the seventh embodiment. In this case, the gate electrode 7 of the memory transistor Qm of the memory cell MC9 is formed to have a flat shape. The gate dielectric 2 between the gate electrode 7 and the substrate 1 is also formed to have a flat shape. Note that the band structure of the gate dielectric 2 is the same as that described in the first embodiment.

A cap insulator 27 formed of, for example, a silicon oxide film is formed on the upper surface of the gate electrode 7. The gate electrode 5 of the select transistor Qs is formed on one side surface of the gate electrode 7 via a sidewall 28 formed of, for example, a silicon oxide film. Therefore, the gate electrodes 5 and 7 are isolated from each other. The upper portion of the gate electrode 5 is roundly tapered. The gate electrode 5 is formed in a self-alignment manner by the anisotropic dry etching.

In this structure, the gate electrode 7 of the memory transistor Qm can be formed to have a flat shape, and the electric field applied to the laminated layer can be made uniform. Therefore, it is possible to inject the holes more uniformly in comparison to the sixth embodiment described above.

Figure 33:
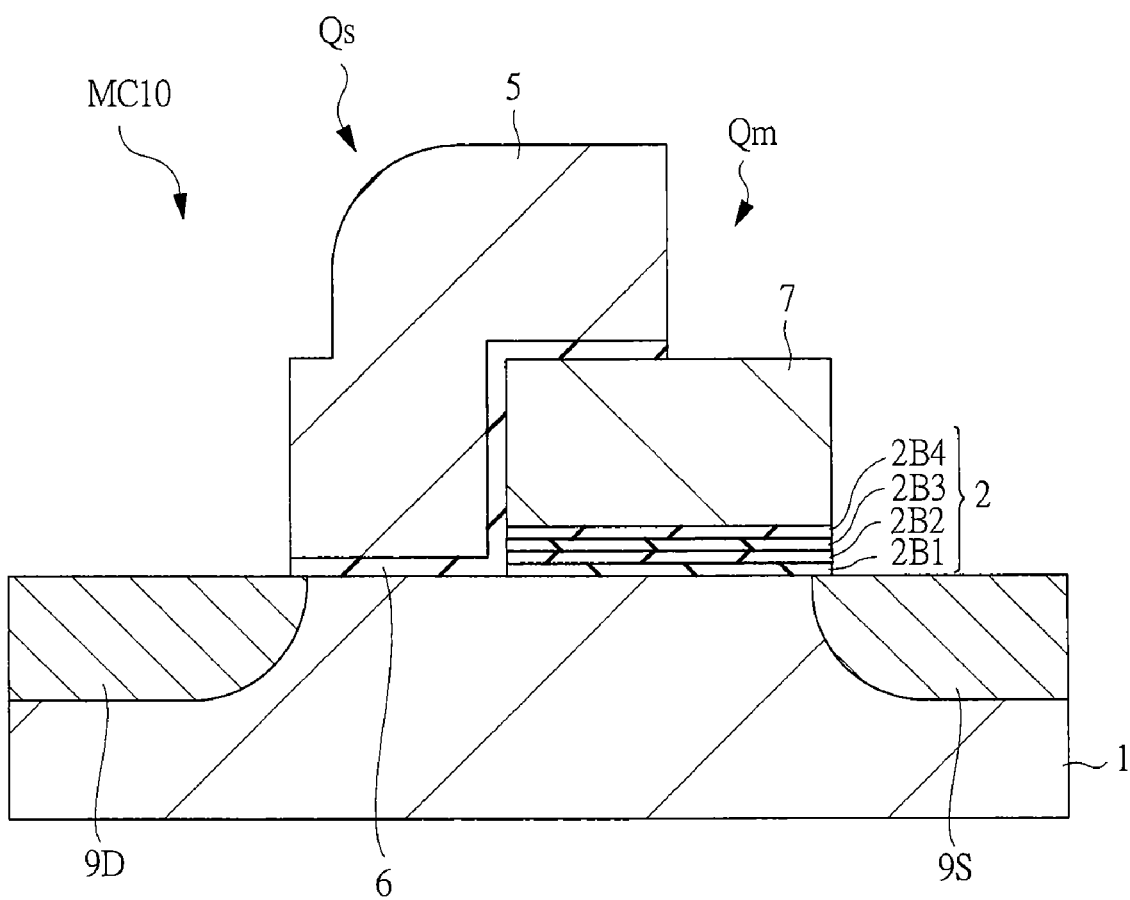
FIG. 33 is a cross-sectional view showing a non-volatile memory cell of a semiconductor device according to still another embodiment of the present invention.

The case where the gate electrode 5 of the select transistor Qs is formed in a self-alignment manner has been described here. However, like the memory cell MC10 shown in FIG. 33, it is also possible to perform the patterning so that the gate electrode 5 of the select transistor Qs is formed on the side surface of the gate electrode 7 of the memory transistor Qm and on the upper surface of the gate electrode 7.

In this case, since the gate electrodes of the MOSFETs of the peripheral CMOS circuit can be formed simultaneously when the gate electrode 5 is patterned, the process can be simplified.

In the foregoing, the invention made by the inventors of the present invention has been concretely described based on the embodiments. However, it is needless to say that the present invention is not limited to the foregoing embodiments and various modifications and alterations can be made within the scope of the present invention.

The present invention can be applied to the manufacture of a semiconductor device having a non-volatile memory structure.

What is claimed is:

1. A semiconductor device comprising:
    a non-volatile memory element in which a gate dielectric formed on a main surface of a semiconductor substrate is used as a charge-trapping layer,
    wherein the gate dielectric has a structure in which a first insulator, a second insulator, a third insulator, and a fourth insulator are laminated in this order from a side of the semiconductor substrate, and the third insulator has a bandgap larger than a bandgap of the second insulator and has an energy barrier to charges,
    wherein electrons and holes are used as trapped charges for the gate dielectric used as the charge-trapping layer, the electrons are injected into the charge-trapping layer from the semiconductor substrate, and the holes are injected into the charge-trapping layer from a gate electrode formed on the gate dielectric, and
    wherein the third and fourth insulators have thicknesses such that the injected holes reach the second insulator by tunneling through the fourth and third insulators, the fourth insulator being formed of a silicon oxide film.

2. The semiconductor device according to claim 1,
    wherein the first insulator is formed of a silicon oxide film, the second insulator is formed of a silicon nitride film, the third insulator is formed of a silicon nitride film containing oxygen.

3. The semiconductor device according to claim 2,
    wherein a composition ratio of silicon of the second insulator is larger than a composition ratio of silicon of a silicon nitride film of stoichiometric composition.

4. The semiconductor device according to claim 1,
    wherein a dielectric constant of the third insulator is lower than a dielectric constant of the second insulator.

5. The semiconductor device according to claim 1,
wherein the gate electrode is made of p type polycrystalline silicon.

6. The semiconductor device according to claim 1,
wherein the electrons in a hot-carrier state are injected, and the holes are injected by means of tunneling.

7. The semiconductor device according to claim 1, wherein the fourth insulator has a thickness of about 1 nm.

8. A semiconductor device comprising:
a first insulator gate field effect transistor for forming a non-volatile memory element formed on a main surface of a semiconductor substrate; and
a second insulator gate field effect transistor formed adjacent to the first insulator gate field effect transistor on the main surface of the semiconductor substrate,
wherein the first insulator gate field effect transistor includes: a first gate dielectric used as a charge-trapping layer formed on the main surface of the semiconductor substrate; and a first gate electrode formed on the first gate dielectric,
wherein the second insulator gate field effect transistor includes: a second gate dielectric formed on the main surface of the semiconductor substrate; and a second gate electrode formed on the second gate dielectric,
wherein the first gate dielectric has a structure in which a first insulator, a second insulator, a third insulator, and a fourth insulator are laminated in this order from a side of the semiconductor substrate, and the third insulator has a bandgap larger than a bandgap of the second insulator and has an energy barrier to charges,
wherein electrons and holes are used as trapped charges for the first gate dielectric used as the charge-trapping layer, the electrons are injected from a side of the semiconductor substrate, and the holes are injected from a side of the first gate electrode, and
wherein the third and fourth insulators have thicknesses such that the injected holes reach the second insulator by tunneling through the fourth and third insulators, the fourth insulator being formed of a silicon oxide film.

9. The semiconductor device according to claim 8,
wherein a first diffusion layer, a first channel controlled by the first gate electrode, a second channel controlled by the second gate electrode, and a second diffusion layer are arranged in an arrangement direction of the first gate electrode and the second gate electrode in the main surface of the semiconductor substrate, and
wherein a change in voltage characteristics of current flowing between the first diffusion layer and the second diffusion layer by the first gate electrode corresponds to stored data.

10. The semiconductor device according to claim 8,
wherein the non-volatile memory element is selected by voltage applied to the second gate electrode.

11. The semiconductor device according to claim 8,
wherein a high-field region is formed in a channel between the first gate electrode and the second gate electrode by the first and second insulator gate field effect transistors, and electrons are injected into the first gate dielectric by source side injection.

12. The semiconductor device according to claim 8,
wherein the first insulator is formed of a silicon oxide film, the second insulator is formed of a silicon nitride film, the third insulator is formed of a silicon nitride film containing oxygen.

13. The semiconductor device according to claim 8,
wherein the fourth insulator has a thickness of about 1 nm.

14. A semiconductor device comprising:
a first insulator gate field effect transistor for forming a non-volatile memory element formed on a main surface of a semiconductor substrate; and
a second insulator gate field effect transistor formed adjacent to the first insulator gate field effect transistor on the main surface of the semiconductor substrate,
wherein the first insulator gate field effect transistor includes: a first gate dielectric used as a charge-trapping layer formed on the main surface of the semiconductor substrate; and a first gate electrode formed on the first gate dielectric,
wherein the second insulator gate field effect transistor includes: a second gate dielectric formed on the main surface of the semiconductor substrate; and a second gate electrode formed on the second gate dielectric,
wherein electrons and holes are used as trapped charges, the electrons are injected from a side of the semiconductor substrate, and the holes are injected from a side of the first gate electrode,
wherein the charge-trapping layer includes a charge-trapping film and a tunnel film laminated in an upper portion of the charge-trapping layer, and
wherein the tunnel film has a thickness such that the injected holes reach the charge-trapping film by tunneling through the tunnel film, the tunnel film including a silicon oxide film.

15. The semiconductor device according to claim 14, wherein the silicon oxide film has a thickness of about 1 nm.

* * * * *